United States Patent
Yamashita et al.

(10) Patent No.: US 12,185,012 B2
(45) Date of Patent: Dec. 31, 2024

(54) IMAGING DEVICE AND ELECTRONIC APPARATUS

(71) Applicant: Sony Semiconductor Solutions Corporation, Kanagawa (JP)

(72) Inventors: Tomonori Yamashita, Kanagawa (JP); Atsushi Muto, Shizuoka (JP)

(73) Assignee: Sony Semiconductor Solutions Corporation, Kanagawa (JP)

(*) Notice: Subject to any disclaimer, the term of this patent is extended or adjusted under 35 U.S.C. 154(b) by 0 days.

(21) Appl. No.: 17/928,478

(22) PCT Filed: May 19, 2021

(86) PCT No.: PCT/JP2021/018890
§ 371 (c)(1),
(2) Date: Nov. 29, 2022

(87) PCT Pub. No.: WO2022/009530
PCT Pub. Date: Jan. 13, 2022

(65) Prior Publication Data
US 2023/0209227 A1    Jun. 29, 2023

(30) Foreign Application Priority Data
Jul. 7, 2020 (JP) ................................ 2020-116898

(51) Int. Cl.
*H04N 25/79* (2023.01)
*H04N 25/772* (2023.01)

(52) U.S. Cl.
CPC .......... *H04N 25/79* (2023.01); *H04N 25/772* (2023.01)

(58) Field of Classification Search
CPC ...... H04N 25/79; H04N 25/772; H04N 25/78; H01L 27/14634
See application file for complete search history.

(56) References Cited

U.S. PATENT DOCUMENTS

| 10,015,427 B2 * | 7/2018 | Nakajima | ......... H01L 27/14607 |
| 2017/0155865 A1 * | 6/2017 | Nakajima | ......... H01L 27/14643 |
| 2018/0181827 A1 * | 6/2018 | Kim | ........................ G06V 10/25 |
| 2018/0220093 A1 * | 8/2018 | Murao | ................... H04N 25/76 |

(Continued)

FOREIGN PATENT DOCUMENTS

| CN | 110226325 A | 9/2019 |
| EP | 2871835 A1 | 5/2015 |

(Continued)

OTHER PUBLICATIONS

International Search Report (PCT/ISA/210), International Application No. PCT/JP2021/018890, dated Jul. 20, 2021.

*Primary Examiner* — Albert H Cutler
(74) *Attorney, Agent, or Firm* — Michael Best & Friedrich LLP

(57) ABSTRACT

Imaging devices with increased numbers of parallel analog-digital converters with maintained chip size are disclosed. In one example, an imaging device has a stacked chip structure including semiconductor chips of first through third layers. A pixel array is formed on the semiconductor chip of the first layer. An analog circuit of an analog-digital converter is disposed on the semiconductor chip of the second or third layer. A digital circuit of the analog-digital converter is disposed on the other of the semiconductor chip of the second or third layer.

15 Claims, 25 Drawing Sheets

(56) References Cited

U.S. PATENT DOCUMENTS

2018/0376093 A1* 12/2018 Tsukuda ............ H01L 27/14612
2019/0394414 A1* 12/2019 Kawazu ............... H04N 25/772
2020/0280255 A1    9/2020 Tsukuda

FOREIGN PATENT DOCUMENTS

| EP | 3018894 A1 | 5/2016 | |
|---|---|---|---|
| EP | 3876521 A1 | 9/2021 | |
| JP | 2013179313 A | 9/2013 | |
| JP | 2018148567 A | 9/2018 | |
| JP | 2020072410 A | 5/2020 | |
| JP | 2020102816 A | 7/2020 | |
| WO | 2014007004 A1 | 1/2014 | |
| WO | 2015159728 A1 | 10/2015 | |
| WO | WO-2018142707 A1 * | 8/2018 | ........... H04N 17/002 |
| WO | 2019087764 A1 | 5/2019 | |
| WO | WO-2019087597 A1 | 5/2019 | |
| WO | 2019124113 A1 | 6/2019 | |

\* cited by examiner

IMAGING DEVICE AND ELECTRONIC APPARATUS

TECHNICAL FIELD

The present disclosure relates to an imaging device and an electronic apparatus.

BACKGROUND ART

An imaging device is provided with an analog-digital conversion unit that digitizes an analog pixel signal read from a pixel. The analog-digital conversion unit is a so-called column parallel type analog-digital conversion unit including a plurality of analog-digital converters arranged to correspond to pixel columns.

Furthermore, in the imaging device, a stacked chip structure is employed in which a pixel array unit formed by arranging pixels is formed on a semiconductor chip of a first layer, an analog-digital conversion unit is formed on a semiconductor chip of a second layer, and the semiconductor chip of the first layer and the semiconductor chip of the second layer are stacked (refer to, for example, Patent Document 1). According to this stacked chip structure, since the semiconductor chip of the first layer only needs to have a size (area) sufficient to form a pixel array unit 11, the size of the semiconductor chip of the first layer and the size of the entire chip can be reduced.

CITATION LIST

Patent Document

Patent Document 1: WO 2014/007004A1

SUMMARY OF THE INVENTION

Problems to be Solved by the Invention

In the conventional technique disclosed in Patent Document 1, two or four systems of analog-digital converters are provided in parallel, and analog pixel signals read in parallel from respective pixels in two or four pixel rows are subjected to a digitization process in parallel by the two or four systems of analog-digital converters, and thus it is possible to reduce the time for reading the pixel signals.

However, although a chip size is reduced by the stacked chip structure, in a case where the number of parallel analog-digital converters increases, the size of the semiconductor chip of the second layer and the size of the entire chip increase.

An object of the present disclosure is to provide an imaging device capable of coping with an increase in the number of parallel analog-digital converters while maintaining a chip size in which contribution of a pixel chip formed by arranging pixels is dominant, and an electronic apparatus having the imaging device.

Solutions to Problems

In order to achieve the above object, according to the present disclosure, there is provided an imaging device having a stacked chip structure in which at least three semiconductor chips including a semiconductor chip of a first layer, a semiconductor chip of a second layer, and a semiconductor chip of a third layer are stacked, the imaging device including:

a pixel array unit in which pixels are two-dimensionally arranged in a matrix and that is formed on the semiconductor chip of the first layer;

an analog circuit unit of an analog-digital conversion unit that converts an analog pixel signal read from each pixel of the pixel array unit through a signal line into a digital pixel signal and is disposed on one of the semiconductor chip of the second layer and the semiconductor chip of the third layer; and a digital circuit unit of the analog-digital conversion unit that is disposed on the other of the semiconductor chip of the second layer and the semiconductor chip of the third layer.

Furthermore, an electronic apparatus of the present disclosure for achieving the above object includes the imaging device having the above configuration.

MODE FOR CARRYING OUT THE INVENTION

Figure 1:
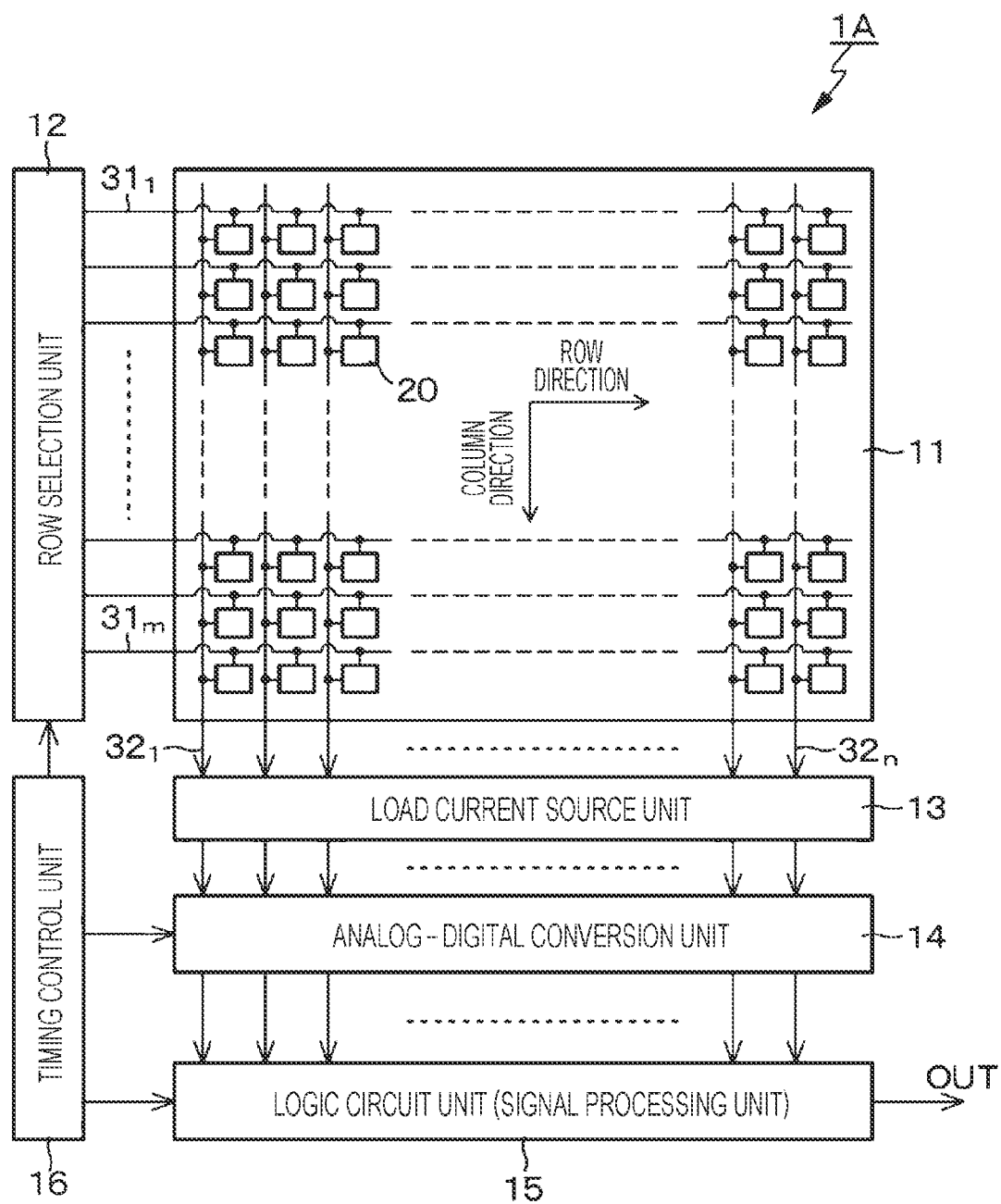
FIG. 1 is a block diagram schematically illustrating an outline of a system configuration of an imaging device according to a first embodiment to which the technology according to the present disclosure is applied.

Hereinafter, modes for carrying out the technology according to the present disclosure (hereinafter, referred to as "embodiments") will be described in detail with reference to the drawings. The technology according to the present disclosure is not limited to the embodiments, and various numerical values and the like in the embodiments are examples. In the following description, the same reference numerals will be used for the same elements or elements having the same functions, and redundant description will be omitted. Note that the description will be given in the following order.

1. General description of imaging device and electronic apparatus of present disclosure
2. Imaging device according to first embodiment
    2-1. Configuration example of CMOS image sensor
    2-2. Circuit configuration example of pixel
    2-3. Configuration example of analog-digital conversion unit
    2-4. Circuit configuration example of comparator
        2-4-1. Circuit configuration example 1
        2-4-2. Circuit configuration example 2
        2-4-3. Circuit configuration example 3
        2-4-4. Circuit configuration example 4
    2-5. Stacked chip structure
3. Imaging device according to second embodiment
    3-1. Configuration example of CMOS image sensor
    3-2. Stacked chip structure
    3-3. Electrical connection structure between semiconductor chips
        3-3-1. Electrical connection structure example 1
        3-3-2. Electrical connection structure example 2
4. Imaging device according to third embodiment
    4-1. Configuration example of CMOS image sensor
    4-2. Stacked chip structure
5. Imaging device according to fourth embodiment
6. Imaging device according to fifth embodiment
7. Imaging device according to sixth embodiment
8. Imaging device according to seventh embodiment
9. Imaging device according to eighth embodiment
10. Modification example
11. Application example
12. Application example of technology according to present disclosure
    12-1. Electronic apparatus of present disclosure (example of imaging system)
    12-2. Application example to moving object
13. Configuration that can be taken by present disclosure <General Description of Imaging Device and Electronic Apparatus of Present Disclosure>

In an imaging device and an electronic apparatus of the present disclosure, an analog-digital conversion unit may include a plurality of analog-digital converters provided to correspond to pixel columns of a pixel array unit, and the analog-digital converter may include a comparator that compares an analog pixel signal with a reference signal of a ramp wave, and a counter that measures a time from a generation timing of the reference signal to an intersection of the analog pixel signal with the reference signal of the ramp wave. Then, the comparator of the analog-digital conversion unit may be disposed on one of a semiconductor chip of a second layer and a semiconductor chip of a third layer, and the counter of the analog-digital conversion unit may be disposed on the other of the semiconductor chip of the second layer and the semiconductor chip of the third layer.

In the imaging device and the electronic apparatus of the present disclosure including the preferable configuration described above, the comparator of the analog-digital conversion unit and a load current source connected to a signal line may be disposed on the semiconductor chip of the second layer, and the counter of the analog-digital conversion unit, a logic circuit unit, and an interface may be disposed on the semiconductor chip of the third layer. Furthermore, on the semiconductor chip of the third layer, a memory unit or an artificial intelligence (AI) circuit may be disposed in addition to the counter of the analog-digital conversion unit, the logic circuit unit, and the interface.

Furthermore, the imaging device and the electronic apparatus of the present disclosure including the preferable configuration described above may include a semiconductor chip of a fourth layer. Then, the memory unit or the AI circuit may be disposed on the semiconductor chip of the fourth layer. Furthermore, a size of the semiconductor chip of the fourth layer may be smaller than sizes of the semiconductor chips of the other layers.

Furthermore, in the imaging device and the electronic apparatus of the present disclosure including the preferable configuration described above, the counter of an analog-digital conversion unit, the logic circuit unit, and the interface may be disposed on a semiconductor chip of the second layer, and the comparator of the analog-digital conversion unit and the load current source connected to the signal line may be disposed on the semiconductor chip of the third layer.

Furthermore, in the imaging device and the electronic apparatus of the present disclosure including the preferable configuration described above, the analog-digital conversion unit may include a plurality of systems of analog-digital conversion units including a first analog-digital conversion unit and a second analog-digital conversion unit that convert each of analog pixel signals read in parallel from respective pixels of a plurality of pixel rows of the pixel array unit into a digital pixel signal. Then, the signal line may be divided into a plurality of signal lines including a first signal line and a second signal line corresponding to the plurality of systems of the analog-digital conversion units for each pixel column in a length direction thereof.

Furthermore, in the imaging device and the electronic apparatus of the present disclosure including the preferable configuration described above, a first connection portion connecting the first signal line to the first analog-digital conversion unit and a second connection portion connecting the second signal line to the second analog-digital conversion unit may be provided close to each other in a region of the pixel array unit. Furthermore, the first connection portion and the second connection portion may connect the semiconductor chip of the first layer to the semiconductor chip of the second layer through direct bonding using a Cu electrode.

<Imaging Device According to First Embodiment>

As an imaging device according to a first embodiment to which the technology according to the present disclosure is applied, a complementary metal oxide semiconductor (CMOS) image sensor, which is a kind of X-Y address type imaging device, will be described as an example. The same applies to the embodiments that will be described later. The CMOS image sensor is an image sensor manufactured by applying or partially using a CMOS process.

Configuration Example of CMOS Image Sensor

FIG. 1 is a block diagram schematically illustrating an outline of a system configuration of a CMOS image sensor which is an example of an imaging device according to a first embodiment to which the technology according to the present disclosure is applied.

A CMOS image sensor 1A according to the first embodiment has a configuration including a pixel array unit 11 and a peripheral circuit unit of the pixel array unit 11. The pixel array unit 11 has a configuration in which pixels (pixel circuits) 20 including light receiving elements are two-dimensionally arranged in a row direction and a column direction, that is, in a matrix. Here, the row direction refers to an arrangement direction of the pixels 20 in the pixel row, and the column direction refers to an arrangement direction of the pixels 20 in the pixel column. The pixel 20 performs photoelectric conversion to generate and accumulate photocharge corresponding to an amount of received light.

The peripheral circuit unit of the pixel array unit 11 includes, for example, a row selection unit 12, a load current source unit 13, an analog-digital conversion unit 14, a logic circuit unit 15 as a signal processing unit, a timing control unit 16, and the like.

In the pixel array unit 11, a pixel control line 31 ($31_1$ to $31_m$) is wired in the row direction for each pixel row with respect to the matrix-like pixel array. Furthermore, a signal line 32 ($32_1$ to $32_n$) is wired in the column direction for each pixel column. The pixel control line 31 transmits a drive signal for performing driving when reading a signal from the pixel 20. In FIG. 1, the pixel control line 31 is illustrated as one wiring, but is not limited to one. One end of the pixel control line 31 is connected to an output end corresponding to each row of the row selection unit 12.

Hereinafter, each constituent of the peripheral circuit unit of the pixel array unit 11, that is, the row selection unit 12, the load current source unit 13, the analog-digital conversion unit 14, the logic circuit unit 15, and the timing control unit 16 will be described.

The row selection unit 12 includes a shift register, an address decoder, and the like, and controls scanning of a pixel row or an address of the pixel row when selecting each pixel 20 of the pixel array unit 11. Although a specific configuration of the row selection unit 12 is not illustrated, the row selection unit 12 generally includes two scanning systems of a read scanning system and a sweep scanning system.

In order to read a pixel signal from the pixel 20, the read scanning system sequentially selects and scans the pixel 20 of the pixel array unit 11 row by row. A pixel signal read from the pixel 20 is an analog signal. The sweep scanning system performs sweep scanning on a read row on which read scanning is performed by the read scanning system prior to the read scanning by a time corresponding to a shutter speed.

Through the sweep scanning performed by the sweep scanning system, unnecessary charge is swept out from the photoelectric conversion units of the pixels 20 in the read row, and the photoelectric conversion units are reset. Then, by sweeping (resetting) unnecessary charge by using the sweeping scanning system, a so-called electronic shutter operation is performed. Here, the electronic shutter operation refers to an operation of discarding the photocharge of the photoelectric conversion unit and starting new exposure (starting accumulation of photocharge).

The load current source unit 13 includes a set of a plurality of load current sources I (refer to FIG. 2) connected to the respective signal lines $32_1$ to $32_n$ for each pixel column. The load current source I may be, for example, a MOS field effect transistor (FET), and supplies a bias current to each pixel 20 of the pixel row selectively scanned by the row selection unit 12 through each of the signal lines $32_1$ to $32_n$.

The analog-digital conversion unit 14 includes a set of a plurality of analog-digital converters provided to correspond to the pixel columns of the pixel array unit 11 (for example, for each pixel column). The analog-digital conversion unit 14 is a column-parallel analog-digital conversion unit that converts an analog pixel signal output through each of the signal lines $32_1$ to $32_n$ for each pixel column into a digital signal.

As the analog-digital converter in the analog-digital conversion unit 14, for example, a single-slope analog-digital converter which is an example of a reference signal comparison type analog-digital converter may be used. However, the analog-digital converter is not limited to the single-slope analog-digital converter, and a successive comparison type analog-digital converter, a delta-sigma modulation type ($\Delta\Sigma$ modulation type) analog-digital converter, or the like may be used.

The logic circuit unit 15, which is a signal processing unit, reads the pixel signal digitized by the analog-digital conversion unit 14 and performs predetermined signal processing. Specifically, in the logic circuit unit 15, for example, correction of a vertical line defect or a point defect, or clamping of a signal, and further, digital signal processing such as parallel-to-serial conversion, compression, encoding, addition, averaging, and intermittent operation are performed as the predetermined signal processing. The logic circuit unit 15 outputs generated image data to a subsequent device as an output signal OUT of the CMOS image sensor 1A.

The timing control unit 16 generates various timing signals, clock signals, control signals, and the like on the basis of a synchronization signal provided from the outside. Then, the timing control unit 16 controls driving of the row selection unit 12, the analog-digital conversion unit 14, the logic circuit unit 15, and the like on the basis of the generated signals.

Circuit Configuration Example of Pixel

Figure 2:
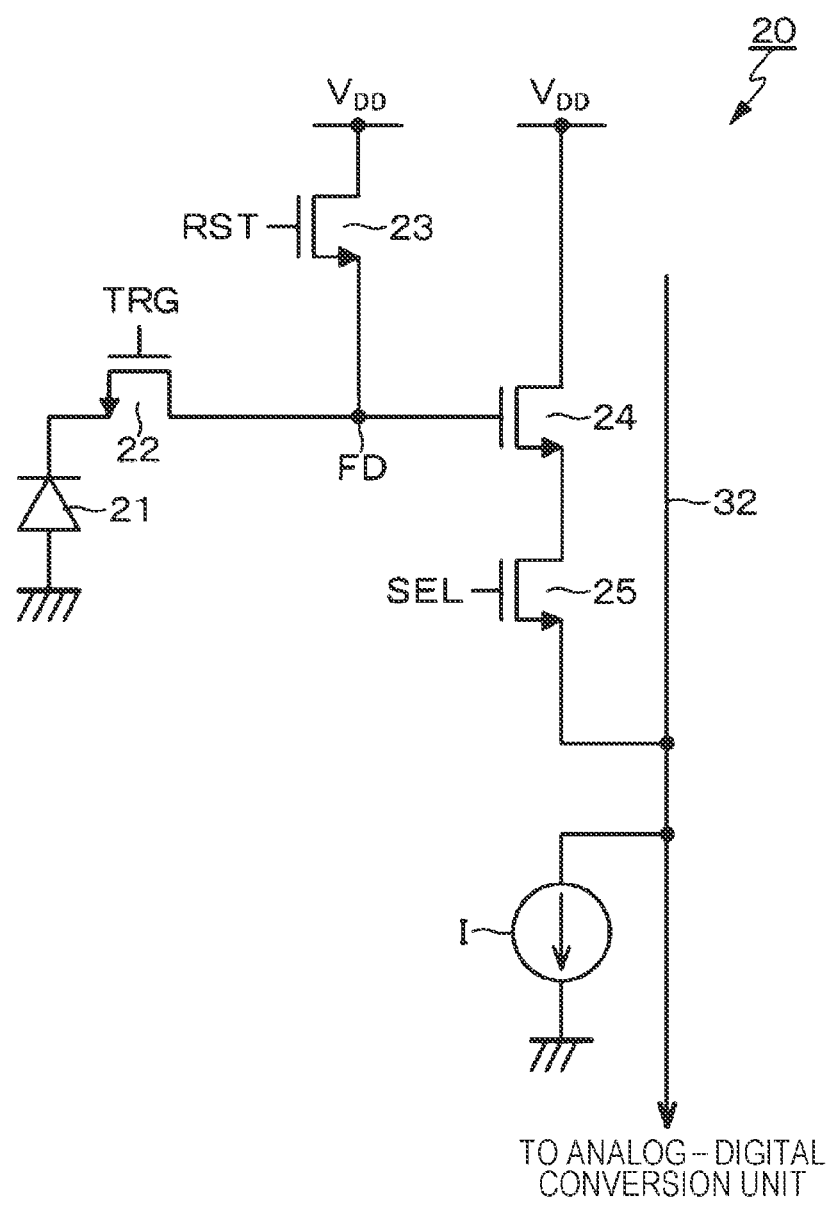
FIG. 2 is a circuit diagram illustrating an example of a circuit configuration of a pixel.

FIG. 2 is a circuit diagram illustrating an example of a circuit configuration of the pixel 20. The pixel 20 includes, for example, a photodiode 21 as a photoelectric conversion element which is a light receiving element. The pixel 20 includes a transfer transistor 22, a reset transistor 23, an amplification transistor 24, and a selection transistor 25 in addition to the photodiode 21.

As the four transistors including the transfer transistor 22, the reset transistor 23, the amplification transistor 24, and the selection transistor 25, for example, N-channel MOS field effect transistors are used. However, a combination of the conductivity types of the four transistors 22 to 25 exemplified here is only an example, and a combination is not limited thereto.

For the pixel 20, a plurality of pixel control lines as the above-described pixel control lines 31 ($31_1$ to $31_m$) is wired in common to each pixel 20 in the same pixel row. The plurality of pixel control lines is connected to output ends of the row selection unit 12 corresponding to the respective pixel rows in units of pixel rows. The row selection unit 12 appropriately outputs a transfer signal TRG, a reset signal RST, and a selection signal SEL to the plurality of pixel control lines.

The photodiode 21 has an anode electrode connected to a low potential side power supply (for example, ground), photoelectrically converts received light into photocharge (here, photoelectrons) of a charge amount corresponding to an amount of the received light, and accumulates the photocharge. A cathode electrode of the photodiode 21 is electrically connected to a gate electrode of the amplification transistor 24 via the transfer transistor 22. Here, a region to which the gate electrode of the amplification transistor 24 is electrically connected is a floating diffusion (floating diffusion region/impurity diffusion region) FD. The floating diffusion FD is a charge-voltage conversion unit that converts electric charge into a voltage.

The transfer signal TRG of which a high level (for example, a $V_{DD}$ level) is an active level is supplied from the row selection unit 12 to a gate electrode of the transfer transistor 22. The transfer transistor 22 is turned on in response to the transfer signal TRG to transfer the photocharge photoelectrically converted by the photodiode 21 and accumulated in the photodiode 21 to the floating diffusion FD.

The reset transistor 23 is connected between a node of a high potential side power supply voltage $V_{DD}$ and the floating diffusion FD. The reset signal RST of which a high level is an active level is provided from the row selection unit 12 to a gate electrode of the reset transistor 23. The reset transistor 23 is turned on in response to the reset signal RST, and resets the floating diffusion FD by discarding the electric charge of the floating diffusion FD to the node of the voltage $V_{DD}$.

The amplification transistor 24 has a gate electrode connected to the floating diffusion FD and a drain electrode connected to the node of the high potential side power supply voltage $V_{DD}$. The amplification transistor 24 serves as an input unit of a source follower that reads a signal obtained through photoelectric conversion in the photodiode 21. That is, a source electrode of the amplification transistor 24 is connected to the signal line 32 via the selection transistor 25. Then, the amplification transistor 24 and the current source I connected to one end of the signal line 32 configure a source follower that converts a voltage of the floating diffusion FD into a potential of the signal line 32.

The selection transistor 25 has a drain electrode connected to the source electrode of the amplification transistor 24, and a source electrode connected to the signal line 32. The selection signal SEL of which a high level is an active level is provided from the row selection unit 12 to a gate electrode of the selection transistor 25. The selection transistor 25 is turned on in response to the selection signal SEL to transmit a signal output from the amplification transistor 24 to the signal line 32 with the pixel 20 in a selected state.

Note that, in the above circuit example, as the pixel 20, a four-Tr configuration including the transfer transistor 22, the reset transistor 23, the amplification transistor 24, and the selection transistor 25, that is, including four transistors (Tr) has been described as an example, but the present disclosure is not limited thereto. For example, the selection transistor 25 may be omitted, and the amplification transistor 24 may have the function of the selection transistor 25 such that a three-Tr configuration is provided, or a configuration of five-Tr or more in which the number of transistors is increased as necessary may be provided.

Configuration Example of Analog-Digital Conversion Unit

Next, an example of a configuration of the analog-digital conversion unit 14 will be described. Here, a case where a single-slope analog-digital converter is used as each analog-digital converter of the analog-digital conversion unit 14 will be described as an example.

Figure 3:
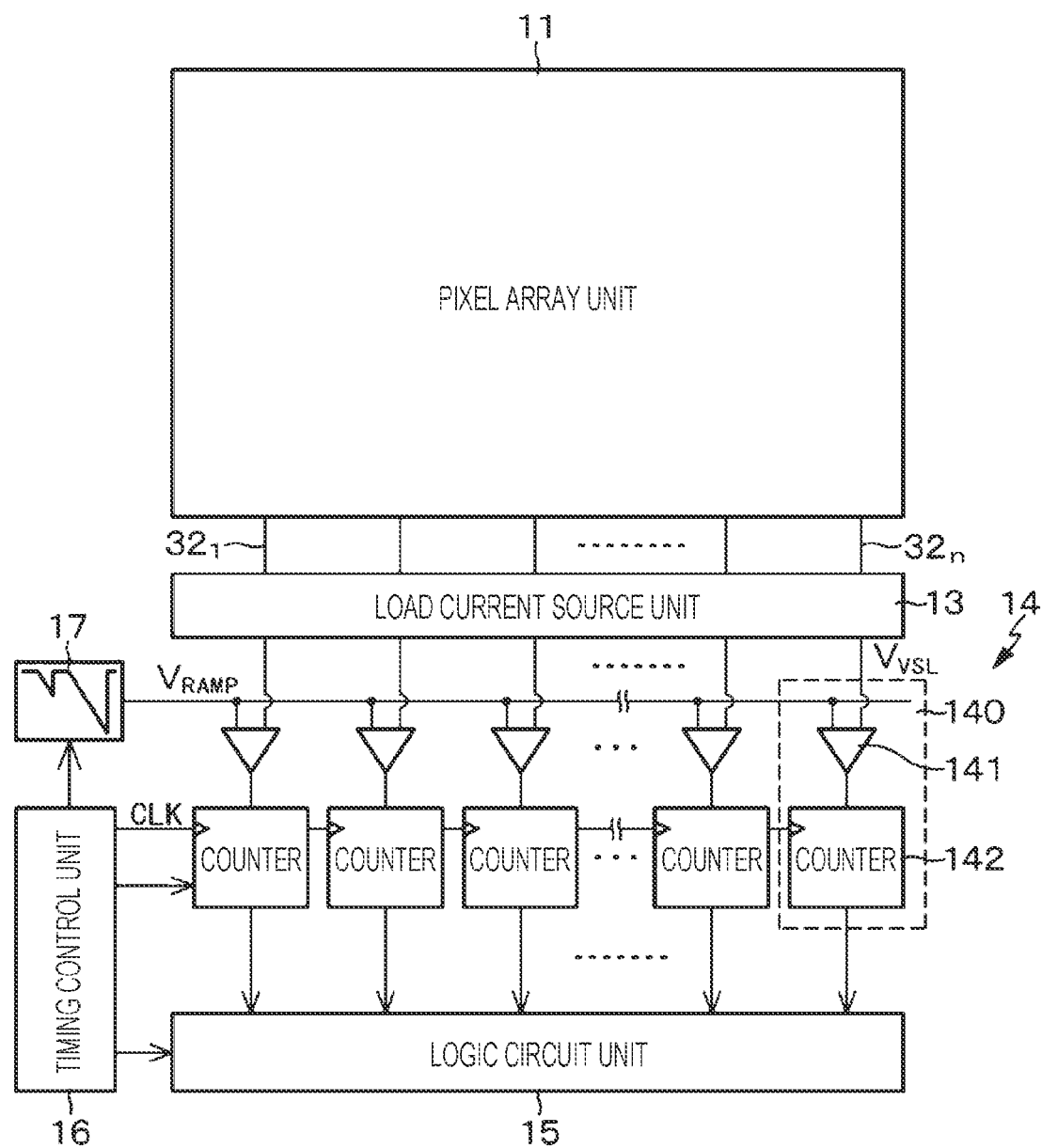
FIG. 3 is a block diagram schematically illustrating an example of a configuration of an analog-digital conversion unit.

FIG. 3 illustrates an example of a configuration of the analog-digital conversion unit 14. In the CMOS image sensor 1A according to the first embodiment, the analog-digital conversion unit 14 includes a set of a plurality of single-slope analog-digital converters provided to correspond to the respective pixel columns of the pixel array unit 11. Here, the single-slope analog-digital converter 140 of the n-th column will be described as an example.

The analog-digital converter 140 has a circuit configuration including a comparator 141 and a counter 142. Then, in the single-slope analog-digital converter 140, the reference signal generated by the reference signal generation unit 17 is used. The reference signal generation unit 17 generates a reference signal $V_{RAMP}$ of a ramp (RAMP) wave of which a level (voltage) monotonously decreases with the passage of time, and provides the reference signal $V_{RAMP}$ to the comparator 141 provided for each pixel column as a reference signal.

The comparator 141 uses an analog pixel signal $V_{VSL}$ read from the pixel 20 as a comparison input and the reference signal $V_{RAMP}$ of the ramp wave generated by the reference signal generation unit 17 as a reference input, and compares both signals. Then, for example, when the reference signal $V_{RAMP}$ is larger than the pixel signal $V_{VSL}$, an output of the comparator 141 enters a first state (for example, a high level), and when the reference signal $V_{RAMP}$ is equal to or smaller than the pixel signal $V_{VSL}$, the output enters a second state (for example, a low level). Therefore, the comparator 141 outputs, as a comparison result, a pulse signal having a pulse width corresponding to a signal level of the pixel signal VVSL, specifically, a magnitude of the signal level.

A clock signal CLK is provided from the timing control unit 16 to the counter 142 at the same timing as a supply start timing of the reference signal $V_{RAMP}$ to the comparator 141. Then, the counter 142 performs a counting operation in synchronization with the clock signal CLK to measure a period of the pulse width of the output pulse of the comparator 141, that is, a period from the start of the comparison operation to the end of the comparison operation. The counting result (count value) from the counter 142 is supplied to the logic circuit unit 15 as a digital value obtained by digitizing the analog pixel signal $V_{VSL}$.

As described above, the analog-digital conversion unit 14 including a set of single-slope analog-digital converters 140 obtains a digital value on the basis of the time information until a magnitude relationship between the reference signal $V_{RAMP}$ of the ramp wave generated by the reference signal generation unit 17 and the analog pixel signal $V_{VSL}$ output from the pixel 20 changes.

Note that, in the above example, as the analog-digital conversion unit 14, a configuration in which the analog-digital converter 140 is disposed in a one-to-one correspondence with the pixel column of the pixel array unit 11 has been exemplified, but a configuration in which the analog-digital converter 140 is disposed in units of a plurality of pixel columns may also be used.

Circuit Configuration Example of Comparator

As the comparator 141 of the analog-digital converter 140, comparators having various configurations may be used. Hereinafter, a specific circuit configuration example of a comparator that may be used as the comparator 141 of the analog-digital converter 140 will be described.

Circuit Configuration Example 1

Figure 4:
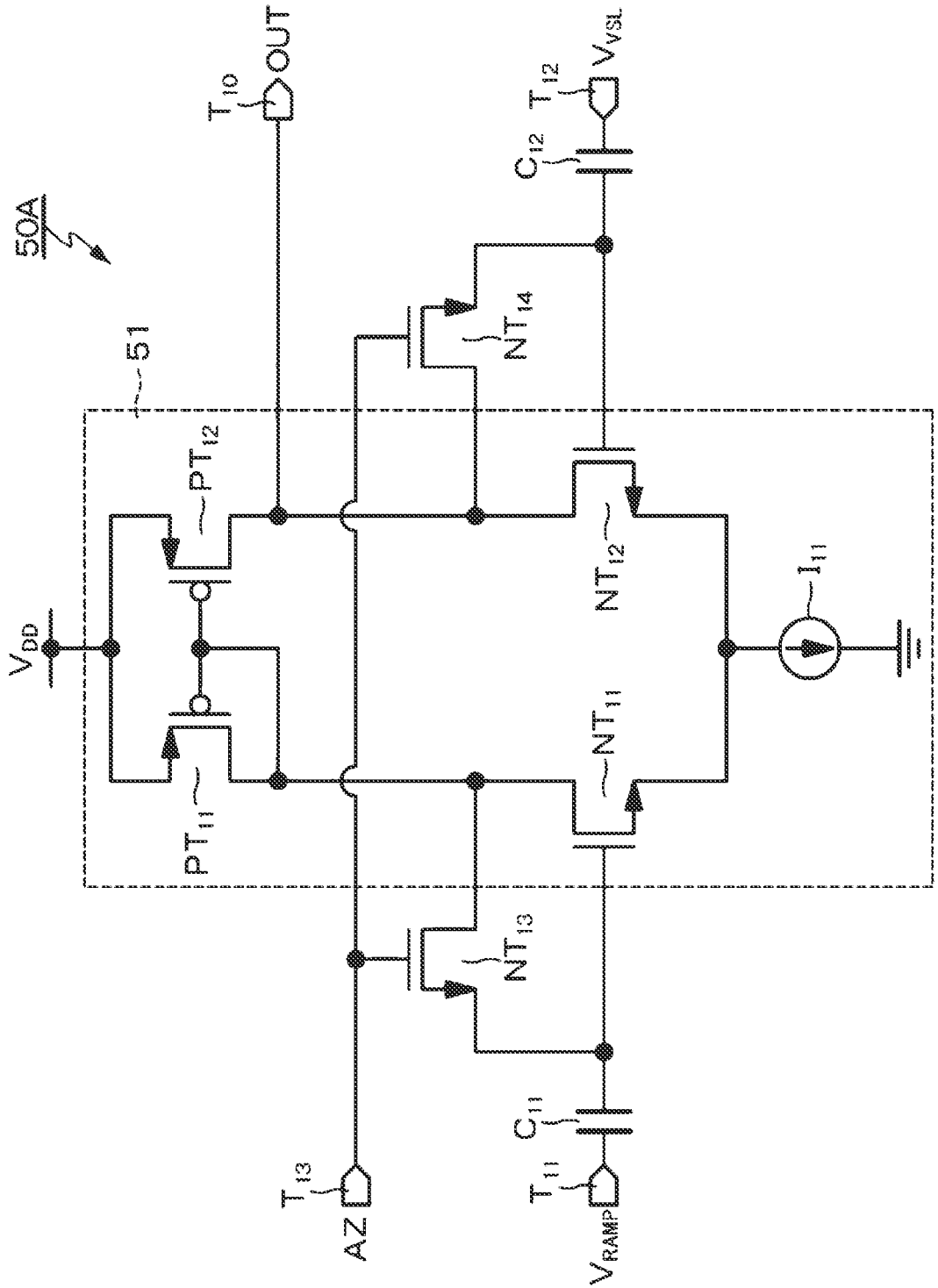
FIG. 4 is a circuit diagram illustrating a circuit configuration of a comparator according to a circuit configuration example 1.

FIG. 4 is a circuit diagram illustrating a circuit configuration of a comparator according to a circuit configuration example 1. A comparator 50A according to the circuit configuration example 1 includes a differential amplifier 51, a first capacitive element $C_{11}$, a second capacitive element $C_{12}$, a first switch transistor $NT_{13}$, and a second switch transistor $NT_{14}$.

The first switch transistor $PT_{13}$ and the second switch transistor $PT_{14}$ are examples of switch elements. Here, for example, N-channel MOS transistors are used as the first switch transistor $PT_{13}$ and the second switch transistor $PT_{14}$, but P-channel MOS transistors may be used.

The differential amplifier 51 includes a first differential transistor $NT_{11}$, a second differential transistor $NT_{12}$, a current source $I_{11}$, a first load transistor $PT_{11}$, and a second load transistor $PT_{12}$. Here, N-channel MOS transistors are used as the first differential transistor $NT_{11}$ and the second differential transistor $NT_{12}$, and P-channel MOS transistors are used as the first load transistor $PT_1$ and the second load transistor $PT_{12}$.

In the differential amplifier 51, source electrodes of the first differential transistor $NT_{11}$ and the second differential transistor $NT_{12}$ are connected to each other to form a differential pair that performs a differential operation. The current source $I_{11}$ is connected between the source common connection node of the first differential transistor $NT_{11}$ and the second differential transistor $NT_{12}$ and the ground GND. The first load transistor $PT_{11}$ has a diode connection configuration in which a gate electrode and a drain electrode are connected to each other, and is connected in series to the first differential transistor $NT_{11}$. That is, the drain electrodes of the first load transistor $PT_{11}$ and the first differential transistor $NT_{11}$ are connected to each other.

The second load transistor $PT_{12}$ is connected in series to the second differential transistor $NT_{12}$. That is, drain electrodes of the second load transistor $PT_{12}$ and the second differential transistor $NT_{12}$ are connected to each other. Then, gate electrodes of the first load transistor $PT_{11}$ and the second load transistor $PT_{12}$ are connected to each other to configure a current mirror circuit.

Furthermore, a common connection node $N_{11}$ between the second differential transistor $NT_{12}$ and the second load transistor $PT_{12}$ serves as an output node of the differential amplifier 51, and an output signal OUT is derived from the output node through an output terminal $T_{10}$. The source electrodes of the first load transistor $PT_{11}$ and the second load transistor $PT_{12}$ are connected to the node of the power supply voltage $V_{DD}$.

The first capacitive element $C_{11}$ is connected between an input terminal $T_{11}$ of the reference signal $V_{RAMP}$ of the ramp wave and the gate electrode of the first differential transistor $NT_{11}$, and serves as an input capacitor for the reference signal $V_{RAMP}$. The second capacitive element $C_{12}$ is connected between an input terminal $T_{12}$ of the pixel signal $V_{VSL}$ and the gate electrode of the second differential transistor $NT_{12}$, and serves as an input capacitor for the pixel signal $V_{VSL}$.

The first switch transistor $NT_{13}$ is connected between the gate electrode and the drain electrode of the first differential transistor $NT_{11}$. The second switch transistor $NT_{14}$ is connected between the gate electrode and the drain electrode of the second differential transistor $NT_{12}$. The first switch transistor $NT_{13}$ and the second switch transistor $NT_{14}$ selectively perform auto-zeroing (initialization operation) by being subjected to ON (conduction)/OFF (non-conduction) control by a drive signal AZ input from the timing control unit 16 illustrated in FIG. 1 via an input terminal $T_{13}$.

The comparator 50A according to the circuit configuration example 1 described above is a well-known comparator having a differential amplifier configuration. In the case of the comparator 50A according to the circuit configuration example 1, since it is necessary to secure an input range according to a signal amount of the pixel 20, it is necessary to set the power supply voltage $V_{DD}$ relatively high (for example, about 1.8 V).

Circuit Configuration Example 2

Figure 5:
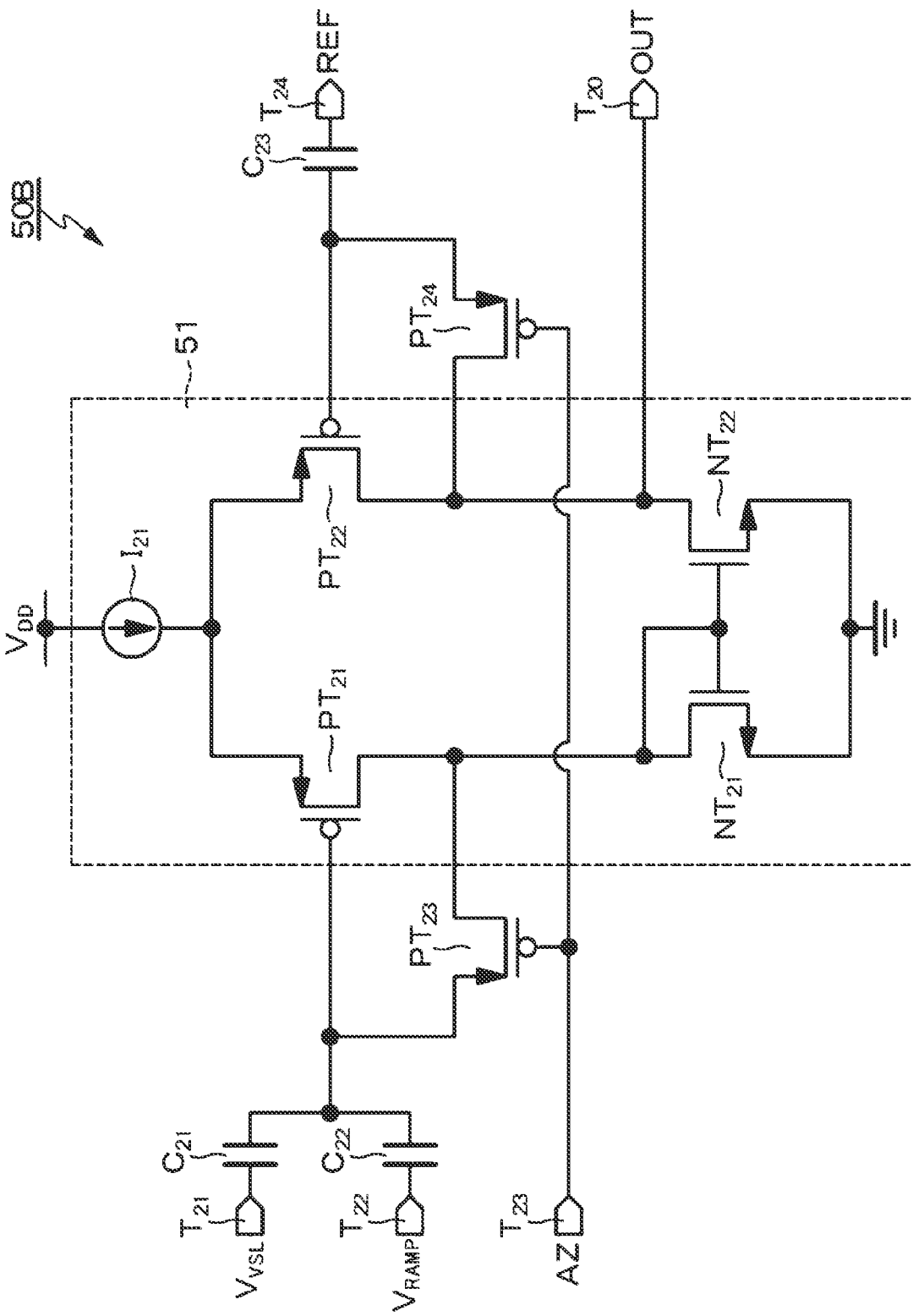
FIG. 5 is a circuit diagram illustrating a circuit configuration of a comparator according to a circuit configuration example 2.

FIG. 5 is a circuit diagram illustrating a circuit configuration of a comparator according to a circuit configuration example 2. A comparator 50B according to the circuit configuration example 2 includes a differential amplifier 51, a first capacitive element $C_{21}$, a second capacitive element $C_{22}$, a third capacitive element $C_{23}$, a first switch transistor $PT_{23}$, and a second switch transistor $PT_{24}$.

The first switch transistor $PT_{23}$ and the second switch transistor $PT_{24}$ are examples of an auto-zero switch. Here, for example, P-channel MOS transistors are used as the first switch transistor $PT_{23}$ and the second switch transistor $PT_{24}$, but N-channel MOS transistors may be used.

The differential amplifier 51 includes a first differential transistor $PT_{21}$, a second differential transistor $PT_{22}$, a current source $I_{21}$, a first load transistor $NT_{21}$, and a second load transistor $NT_{22}$. Here, P-channel MOS transistors are used as the first differential transistor $PT_{21}$ and the second differential transistor $PT_{22}$, and N-channel MOS transistors are used as the first load transistor $NT_{21}$ and the second load transistor $NT_{22}$. However, these differential transistors and load transistors may be configured with reverse channels (reverse conductivity types).

In the differential amplifier 51, source electrodes of the first differential transistor $PT_{21}$ and the second differential transistor $PT_{22}$ are connected to each other to form a differential pair that performs a differential operation. The current source $I_{21}$ is connected between a source common connection node of the first differential transistor $PT_{21}$ and the second differential transistor $PT_{22}$ and a node of the power supply voltage $V_{DD}$. The first load transistor $NT_{21}$ has a diode connection configuration in which a gate electrode and a drain electrode are connected to each other, and is connected in series to the first differential transistor $PT_{21}$. That is, drain electrodes of the first load transistor $NT_{21}$ and the first differential transistor $PT_{21}$ are connected to each other.

The second load transistor $NT_{22}$ is connected in series to the second differential transistor $PT_{22}$. That is, the drain electrodes of the second load transistor $NT_{22}$ and the second differential transistor $PT_{22}$ are connected to each other. Then, gate electrodes of the first load transistor $NT_{21}$ and the second load transistor $NT_{22}$ are connected to each other to configure a current mirror circuit.

Furthermore, a common connection node between the second differential transistor $PT_{22}$ and the second load transistor $NT_{22}$ serves as an output node of the differential amplifier 51, and the output signal OUT is derived from the output node through an output terminal $T_{20}$. The source electrodes of the first load transistor $NT_{21}$ and the second load transistor $NT_{22}$ are connected to a low potential side power supply, for example, the ground GND.

The first capacitive element $C_{21}$ is connected between the input terminal $T_{21}$ of the pixel signal $V_{VSL}$ and the gate electrode of the first differential transistor $PT_{21}$, and serves as an input capacitor for the pixel signal $V_{VSL}$. The second capacitive element $C_{22}$ is connected between the input terminal $T_{22}$ of the reference signal $V_{RAMP}$ of the ramp wave and the gate electrode of the first differential transistor $PT_{21}$, and serves as an input capacitor for the reference signal $V_{RAMP}$. Therefore, the first differential transistor $PT_{21}$ uses, as a gate input, a signal obtained by combining (adding) the pixel signal $V_{VSL}$ and the reference signal $V_{RAMP}$ through the first capacitive element $C_{21}$ and the second capacitive element $C_{22}$.

The first switch transistor $PT_{23}$ is connected between the gate electrode and the drain electrode of the first differential transistor $PT_{21}$. The second switch transistor $PT_{24}$ is connected between the gate electrode and the drain electrode of the second differential transistor $PT_{22}$. The first switch transistor $PT_{23}$ and the second switch transistor $PT_{24}$ selectively perform auto-zeroing (initialization operation) by being subjected to ON/OFF control by the drive signal AZ input from the timing control unit 16 illustrated in FIG. 1 via an input terminal $T_{23}$.

The third capacitive element $C_{23}$ is connected between the gate electrode of the second differential transistor PT22 and an input terminal $T_{24}$ of a predetermined voltage REF. Therefore, the second differential transistor $PT_{22}$ uses the predetermined voltage REF provided through the terminal $T_{24}$ as a gate input via the third capacitive element $C_{23}$. The predetermined voltage REF is any constant voltage such as the power supply voltage $V_{DD}$ level or the ground (GND) level. Here, the predetermined voltage REF is set to the GND level.

According to the comparator 50B according to the circuit configuration example 2 described above, an input voltage of the differential amplifier 51 at the time of inversion of the output signal OUT of the differential amplifier 51 does not vary and is constant regardless of a signal amount of the pixel 20, and thus, it is possible to reduce the power supply voltage $V_{DD}$ (for example, about 1.3 V). As a result, since the power consumption of the analog-digital conversion unit 14 can be reduced, the power consumption of the CMOS image sensor 1A can be reduced.

Circuit Configuration Example 3

Figure 6:
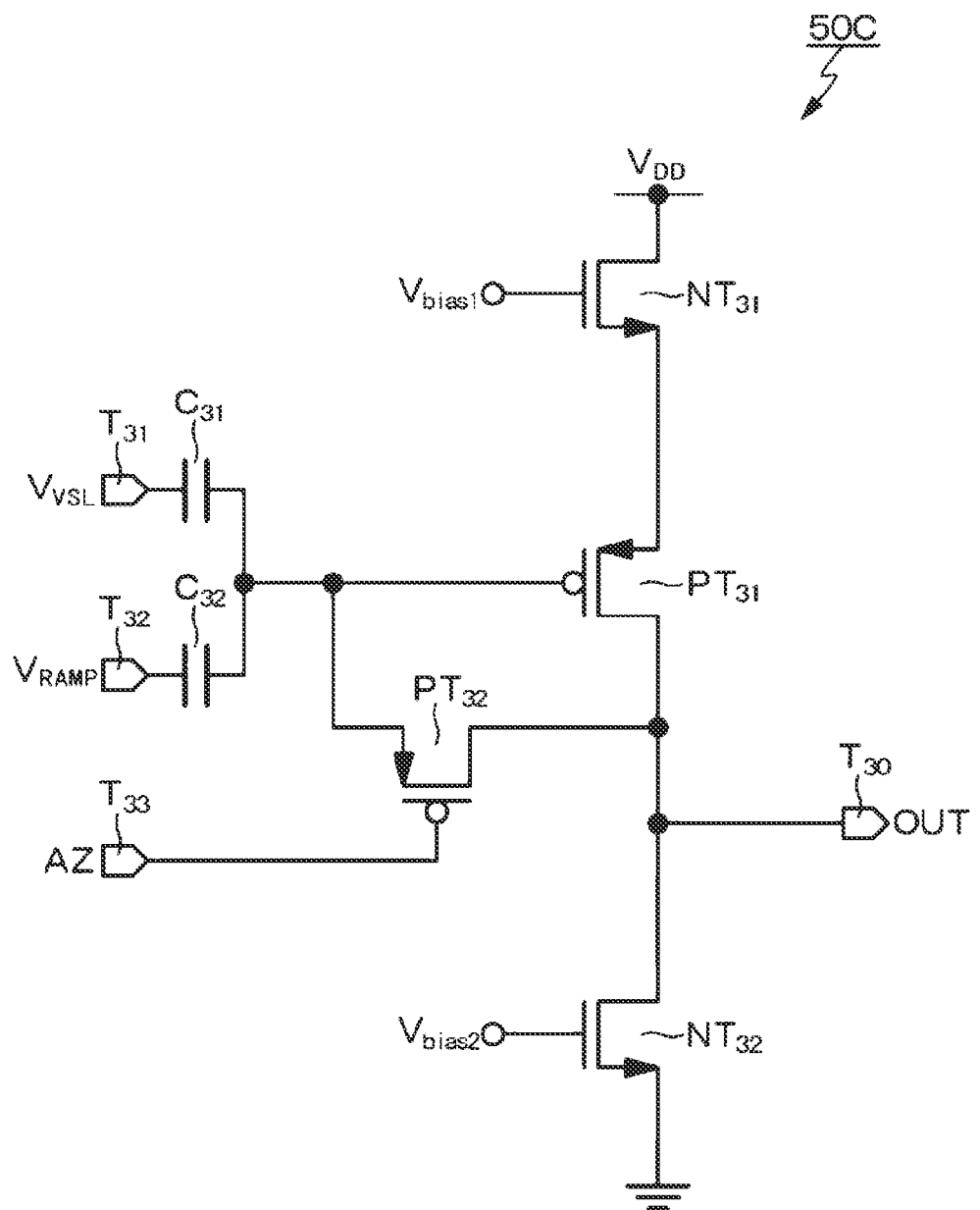
FIG. 6 is a circuit diagram illustrating a circuit configuration of a comparator according to a circuit configuration example 3.

FIG. 6 is a circuit diagram illustrating a circuit configuration of a comparator according to a circuit configuration example 3. A comparator 50C according to the circuit configuration example 3 includes a first capacitive element $C_{31}$, a second capacitive element $C_{32}$, an input transistor $PT_{31}$, a switch transistor $PT_{32}$, a first current source transistor $NT_{31}$, and a second current source transistor $NT_{32}$.

The switch transistor $PT_{32}$ is an example of an auto-zero switch. Here, for example, a P-channel MOS transistor is used as the switch transistor $PT_{32}$, but an N-channel MOS transistor may be used. A predetermined bias voltage $V_{bias1}$ is applied to a gate electrode of the first current source transistor $NT_{31}$. A predetermined bias voltage $V_{bias2}$ is applied to a gate electrode of the second current source transistor $NT_{32}$.

The first current source transistor $NT_{31}$, the input transistor $PT_{31}$, and the second current source transistor $NT_{32}$ are connected in series in this order between a node of the power supply voltage $V_{DD}$ and a low potential side power supply, for example, the ground GND. Then, a common connection node between the input transistor $PT_{31}$ and the second current source transistor $NT_{32}$ serves as an output node, and the output signal OUT is derived from the output node through an output terminal $T_{30}$.

The first capacitive element $C_{31}$ is connected between the input terminal $T_{31}$ of the pixel signal $V_{VSL}$ and the gate electrode of the input transistor $PT_{31}$, and serves as an input capacitor for the pixel signal $V_{VSL}$. The second capacitive element $C_{32}$ is connected between the input terminal $T_{32}$ of the reference signal $V_{RAMP}$ of the ramp wave and the gate electrode of the input transistor $PT_{31}$, and serves as an input capacitor for the reference signal $V_{RAMP}$. Therefore, the input transistor $PT_{31}$ uses, as a gate input, a signal obtained by combining (adding) the pixel signal $V_{VSL}$ and the reference signal $V_{RAMP}$ through the first capacitive element $C_{31}$ and the second capacitive element $C_{32}$.

The switch transistor $PT_{32}$ is connected between the gate electrode and the drain electrode of the input transistor $PT_{31}$. The switch transistor $PT_{32}$ selectively performs auto-zeroing (initialization operation) by being subjected to ON/OFF control by the drive signal AZ input from the timing control unit 16 illustrated in FIG. 1 via an input terminal $T_{33}$.

The comparator 50C according to the circuit configuration example 3 described above is a comparator obtained by singulating the comparator 50B according to the circuit configuration example 2 having a differential amplifier configuration, and can reduce an amount of a current flowing through the second current source transistor $NT_{32}$ to about half of that of the comparator 50B according to the circuit configuration example 2. As a result, compared with the case of the comparator 50B according to the circuit configuration example 2, the power consumption of the analog-digital conversion unit 14 can be further reduced, and furthermore, the power consumption of the CMOS image sensor 1A can be reduced.

Circuit Configuration Example 4

Figure 7:
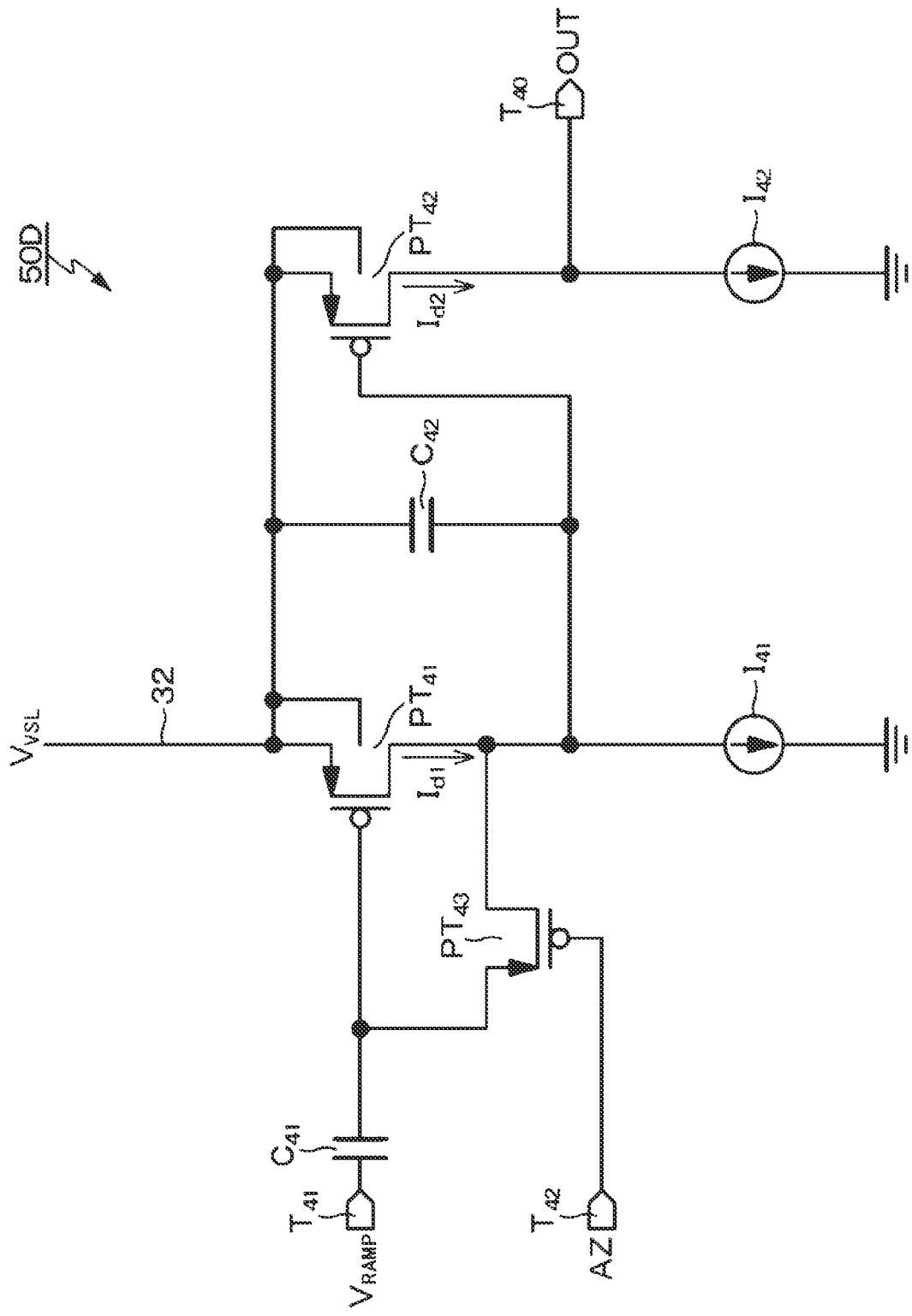
FIG. 7 is a circuit diagram illustrating a circuit configuration of a comparator according to a circuit configuration example 4.

FIG. 7 is a circuit diagram illustrating a circuit configuration of a comparator according to a circuit configuration example 4. A comparator 50D according to the circuit configuration example 4 includes a first capacitive element $C_{41}$, an input transistor $PT_{41}$, an input side load current source $I_{41}$, a second capacitive element $C_{42}$, an output transistor $PT_{42}$, an output side load current source $I_{42}$, and a switch transistor $PT_{43}$.

The input transistor $PT_{41}$ includes a P-channel MOS transistor, and is connected between the signal line 32 and the input side load current source $I_{41}$. Specifically, a source electrode of the input transistor $PT_{41}$ is connected to a signal line 32, and a drain electrode thereof is connected to one end of the input side load current source $I_{41}$. Therefore, the pixel signal $V_{VSL}$ is input to the source electrode of the input transistor $PT_{41}$ through the signal line 32.

The other end of the input side load current source $I_{41}$ is connected to a low potential side power supply, for example, the ground GND. The input side load current source $I_{41}$ supplies a constant current $I_{d1}$ to the series connection circuit of the input transistor $PT_{41}$ and the signal line 32. The input side load current source $I_{41}$ may be configured by using, for example, an N-channel MOS transistor or the like.

The first capacitive element $C_{41}$ is connected between the input terminal $T_{41}$ of the reference signal $V_{RAMP}$ of the ramp wave and the gate electrode of the input transistor $PT_{41}$, and serves as an input capacitor for the reference signal $V_{RAMP}$. Therefore, in the input transistor $PT_{41}$, the pixel signal $V_{VSL}$ is input to the source electrode through the signal line 32, and the reference signal $V_{RAMP}$ of the ramp wave is input to the gate electrode through the first capacitive element $C_{41}$.

The input transistor $PT_{41}$ amplifies a difference between the reference signal $V_{RAMP}$ input to the gate electrode and the pixel signal $V_{VSL}$ input to the source electrode, that is, a gate-source voltage $V_{gs}$ of the input transistor $PT_{41}$, and outputs the amplified difference as a drain voltage from the drain electrode. Note that, in the input transistor $PT_{41}$, the back gate electrode and the source electrode are desirably short-circuited in order to suppress the back gate effect.

The switch transistor $PT_{43}$ is an example of an auto-zero switch connected between the gate electrode and the drain electrode of the input transistor $PT_{41}$. Here, for example, a P-channel MOS transistor is used as the switch transistor $PT_{43}$, but an N-channel MOS transistor may be used. The switch transistor $PT_{43}$ selectively performs auto-zeroing (initialization operation) by being subjected to ON/OFF control by the drive signal AZ input from the timing control unit 16 illustrated in FIG. 1 via an input terminal $T_{42}$.

The second capacitive element $C_{42}$ is connected in parallel to the input transistor $PT_{41}$. Specifically, one end of the second capacitive element $C_{42}$ is connected to the source electrode of the input transistor $PT_{41}$, and the other end of the second capacitive element $C_{42}$ is connected to the drain electrode of the input transistor $PT_{41}$.

The output transistor $PT_{42}$ includes, for example, a P-channel MOS transistor, and is connected between the signal line 32 and the output side load current source 142. Specifically, the source electrode of the output transistor $PT_{42}$ is connected to the signal line 32, and the drain electrode is connected to one end of the output side load current source $I_{42}$. Therefore, the pixel signal $V_{VSL}$ is input to the source electrode of the output transistor $PT_{42}$ through the signal line 32.

The other end of the output side load current source $I_{42}$ is connected to a low potential side power supply, for example, the ground GND. The output side load current source $I_{42}$ supplies a constant current $I_{d2}$ to the series connection circuit of the output transistor $PT_{42}$ and the signal line 32. The output side load current source $I_{42}$ may be configured by using, for example, an N-channel MOS transistor or the like.

A gate electrode of the output transistor $PT_{42}$ is connected to the drain electrode of the input transistor $PT_{41}$. Therefore, a drain voltage of the input transistor $PT_{41}$ is input to the gate electrode of the output transistor $PT_{42}$. The back gate electrode and the source electrode of the output transistor $PT_{42}$ are desirably short-circuited in order to suppress the back gate effect.

The output transistor $PT_{42}$ outputs a signal OUT indicating whether or not a voltage difference between the pixel signal $V_{VSL}$ input to the source electrode through the signal line 32 and the drain voltage of the input transistor $PT_{41}$ input to the gate electrode exceeds a predetermined threshold voltage from the drain electrode through the output terminal $T_{40}$.

Note that the circuit configuration of the comparator 50D according to the circuit configuration example 4 exemplified here is an example, and the present disclosure is not limited to this circuit configuration. Specifically, in the circuit configuration of the subsequent stage of the input transistor $PT_{41}$, for example, a clamp transistor that suppresses a decrease in the drain voltage when the input transistor $PT_{41}$ is in a non-conductive state may be provided in parallel to the input transistor $PT_{41}$. Alternatively, a clamp transistor that limits a lower limit of the drain voltage of the input transistor $PT_{41}$ regardless of a potential of the signal line 32 may be provided in parallel to the input transistor $PT_{41}$.

The comparator 50D according to the circuit configuration example 4 described above has a circuit configuration in which a load current source (corresponding to the load current source I in FIG. 2) connected to the signal line 32 is shared as a load current source used in the comparator 50D in the same singulated comparator as that in the circuit configuration example 3. Also in the case of the comparator 50D according to the circuit configuration example 4, it is possible to achieve low power consumption of the analog-digital conversion unit 14 accompanying a reduction in the power supply voltage $V_{DD}$ of the comparator 50D, and further, low power consumption of the CMOS image sensor 1A.

[Stacked Chip Structure]

Figure 8:
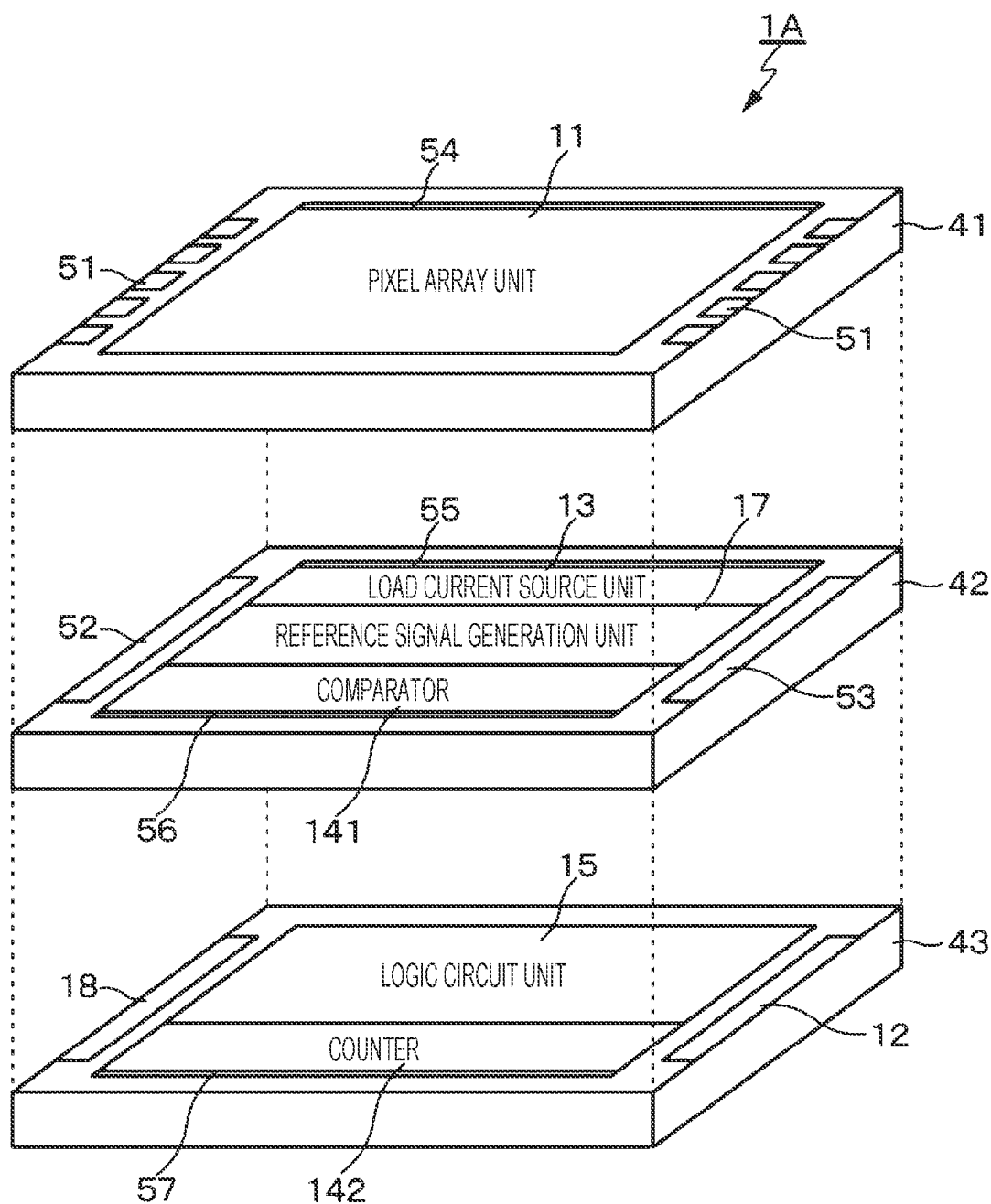
FIG. 8 is a schematic exploded perspective view illustrating a stacked chip structure of a CMOS image sensor according to the first embodiment.

The CMOS image sensor 1A according to the first embodiment has a stacked chip structure in which at least three semiconductor chips such as a semiconductor chip of a first layer, a semiconductor chip of a second layer, and a semiconductor chip of a third layer are stacked. FIG. 8 illustrates a schematic exploded perspective view of a stacked chip structure of the CMOS image sensor 1A according to the first embodiment.

As illustrated in FIG. 8, the CMOS image sensor 1A according to the first embodiment has a stacked chip structure in which a semiconductor chip 41 of a first layer, a semiconductor chip 42 of a second layer, and a semiconductor chip 43 of a third layer are stacked.

Then, the pixel array unit 11 in which the pixels 20 are two-dimensionally arranged in a matrix is formed on the semiconductor chip 41 of the first layer. Furthermore, for example, pads 51 for external connection and power supply are provided at both left and right ends of the semiconductor chip 41 of the first layer.

An analog circuit unit of the analog-digital conversion unit 14, specifically, the comparator 141 of the analog-digital converter 140 is disposed on the semiconductor chip 42 of the second layer. The load current source unit 13 and the reference signal generation unit 17 are further disposed on the semiconductor chip 42 of the second layer. Note that the disposition of the load current source unit 13, the reference signal generation unit 17, and the comparator 141 on the semiconductor chip 42 of the second layer illustrated in FIG. 4 is an example, and is not limited to this disposition example.

A digital circuit unit of the analog-digital conversion unit 14, specifically, the counter 142 of the analog-digital converter 140 is disposed on the semiconductor chip 43 of the third layer. The logic circuit unit 15 which is a signal processing unit, the row selection unit 12, and the interface (I/F) 18 are further disposed on the semiconductor chip 43 of the third layer. Note that the disposition of the counter 142, the logic circuit unit 15, the row selection unit 12, and the interface 18 on the semiconductor chip 43 of the third layer illustrated in FIG. 4 is an example, and is not limited to this disposition example.

For example, connection portions (VIA) 52 and 53 that electrically connect the semiconductor chip 42 to the semiconductor chip 43 are provided at both left and right ends of the semiconductor chip 42 of the second layer. Examples of the connection portions 52 and 53 include a through silicon via (TSV), a metal-metal junction including a Cu—Cu junction, and the like.

In the stacked chip structure described above, the signal line 32 (refer to FIG. 1) wired for each pixel column in the pixel array unit 11 of the semiconductor chip 41 of the first layer and each load current source I (refer to FIG. 2) of the load current source unit 13 disposed on the semiconductor chip 42 of the second layer are electrically connected for each pixel column through the connection portion 54 of the first layer and the connection portion 55 of the second layer. Furthermore, the comparator 141 disposed on the semiconductor chip 42 of the second layer and the counter 142 disposed on the semiconductor chip 43 of the third layer are electrically connected for each pixel column through the connection portion 56 of the second layer and the connection portion 57 of the third layer. Examples of the connection portion 54, the connection portion 55, the connection portion 56, and the connection portion 57 include a through silicon via (TSV), a metal-metal junction including a Cu—Cu junction, and the like.

Note that, in the above example, the analog circuit unit of the analog-digital conversion unit 14 is formed in the semiconductor chip 42 of the second layer, and the digital circuit unit of the analog-digital conversion unit 14 is formed in the semiconductor chip 43 of the third layer. However, an opposite configuration may be employed. That is, the digital circuit unit of the analog-digital conversion unit 14 may be formed in the semiconductor chip 42 of the second layer, and the analog circuit unit of the analog-digital conversion unit 14 may be formed in the semiconductor chip 43 of the third layer.

Furthermore, in the above example, the case where the stacked chip structure is a stacked structure of three layers has been exemplified, but the stacked chip structure is not limited to the stacked structure of three layers, and may be a stacked structure of four or more layers. In a case of a stacked structure of four or more layers, the analog circuit unit and the digital circuit unit of the analog-digital conversion unit 14 can be distributed and disposed on the semiconductor chips of the second and subsequent layers.

As described above, in the CMOS image sensor 1A according to the first embodiment, the stacked chip structure has a stacked structure of three or more layers, and the analog circuit unit and the digital circuit unit of the analog-digital conversion unit 14 are disposed (formed) on semiconductor chips of different layers, and thus the following operations and effects can be achieved.

Figure 9:
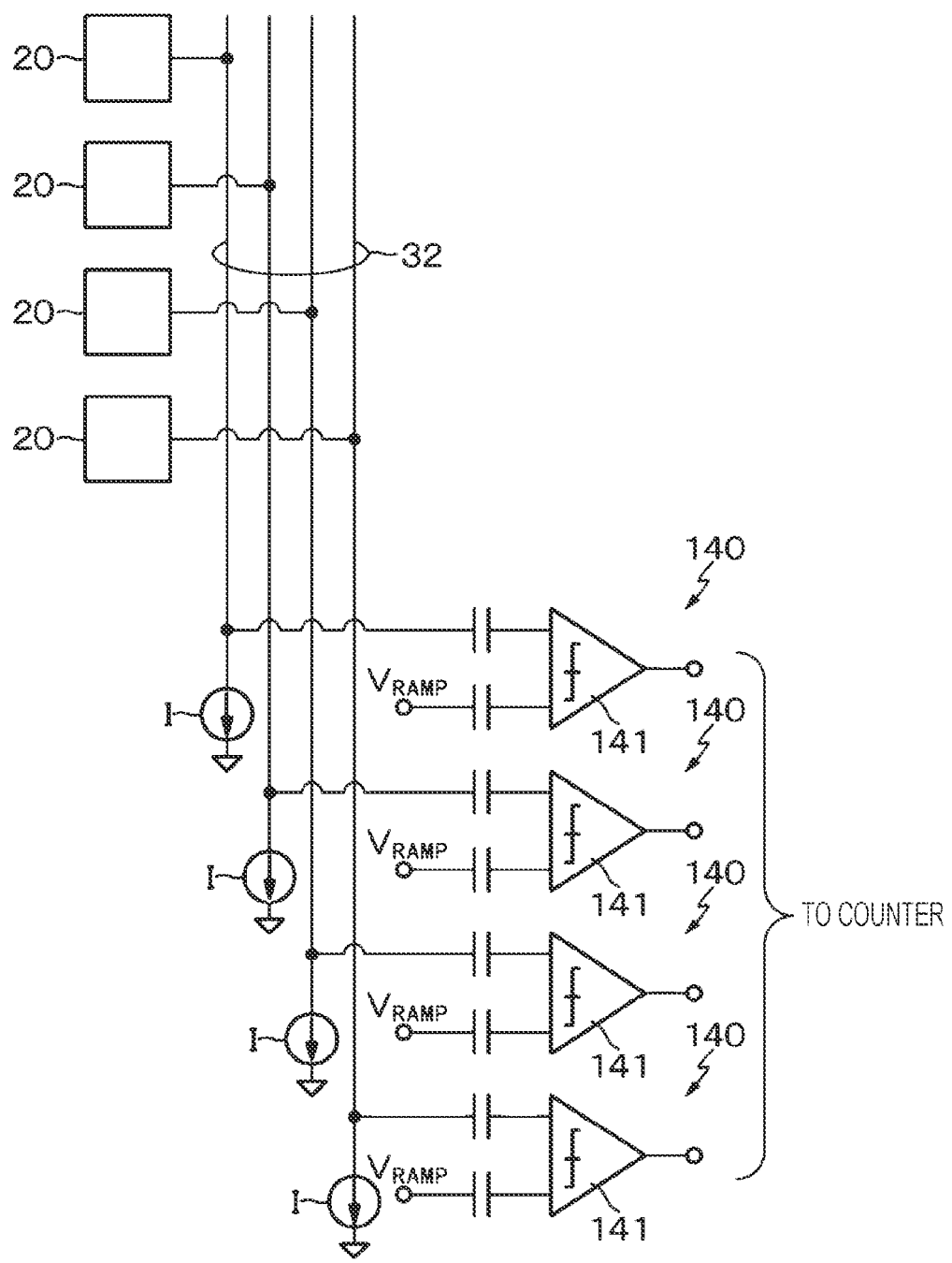
FIG. 9 is a circuit diagram illustrating a connection relationship for one pixel column in a case where a plurality of systems of analog-digital converters is provided in parallel and the number of rows for simultaneous reading is increased.

For example, as illustrated in FIG. 9, in a case where a plurality of systems (for example, four systems) of the analog-digital converters 140 is provided in parallel for each pixel column and the number of rows for simultaneous reading is increased, in a stacked structure of two layers, a size of the semiconductor chip of the second layer and a size of the entire chip are increased by the increase in the number of the parallel analog-digital converters 140. On the other hand, by employing a stacked structure of three or more layers and disposing the analog circuit unit and the digital circuit unit of the analog-digital conversion unit 14 on semiconductor chips of different layers, it is possible to increase the number of parallel analog-digital converters 140 while maintaining a chip size in which the contribution of the semiconductor chip 41 of the first layer in which the pixel array unit 11 is formed is dominant, and thus to improve a frame rate.

Furthermore, according to the CMOS image sensor 1A according to the first embodiment having a stacked chip structure of three or more layers, a process suitable for manufacturing the pixel 20 can be applied to the semiconductor chip 41 of the first layer. Furthermore, in the case of the above example, a low-cost process (for example, 55 nm process) suitable for manufacturing the analog circuit unit of the analog-digital conversion unit 14 can be applied to the semiconductor chip 42 of the second layer, and a process (for example, 22 nm process) suitable for manufacturing the digital circuit unit of the analog-digital conversion unit 14 can be applied to the semiconductor chip 43 of the third layer, so that the characteristics and cost can be optimized. In particular, an advanced process can be applied to manufacturing of the digital circuit unit.

<Imaging Device According to Second Embodiment>

An imaging device according to the second embodiment to which the technology according to the present disclosure is applied includes a CMOS image sensor similarly to the case of the first embodiment. Then, the pixel array unit 11 is divided into a plurality of regions in the column direction, for example, two regions, and correspondingly, the signal line 32 is divided (for example, two divisions) into a plurality of signal lines in the length direction (column direction).

Configuration Example of CMOS Image Sensor

Figure 10:
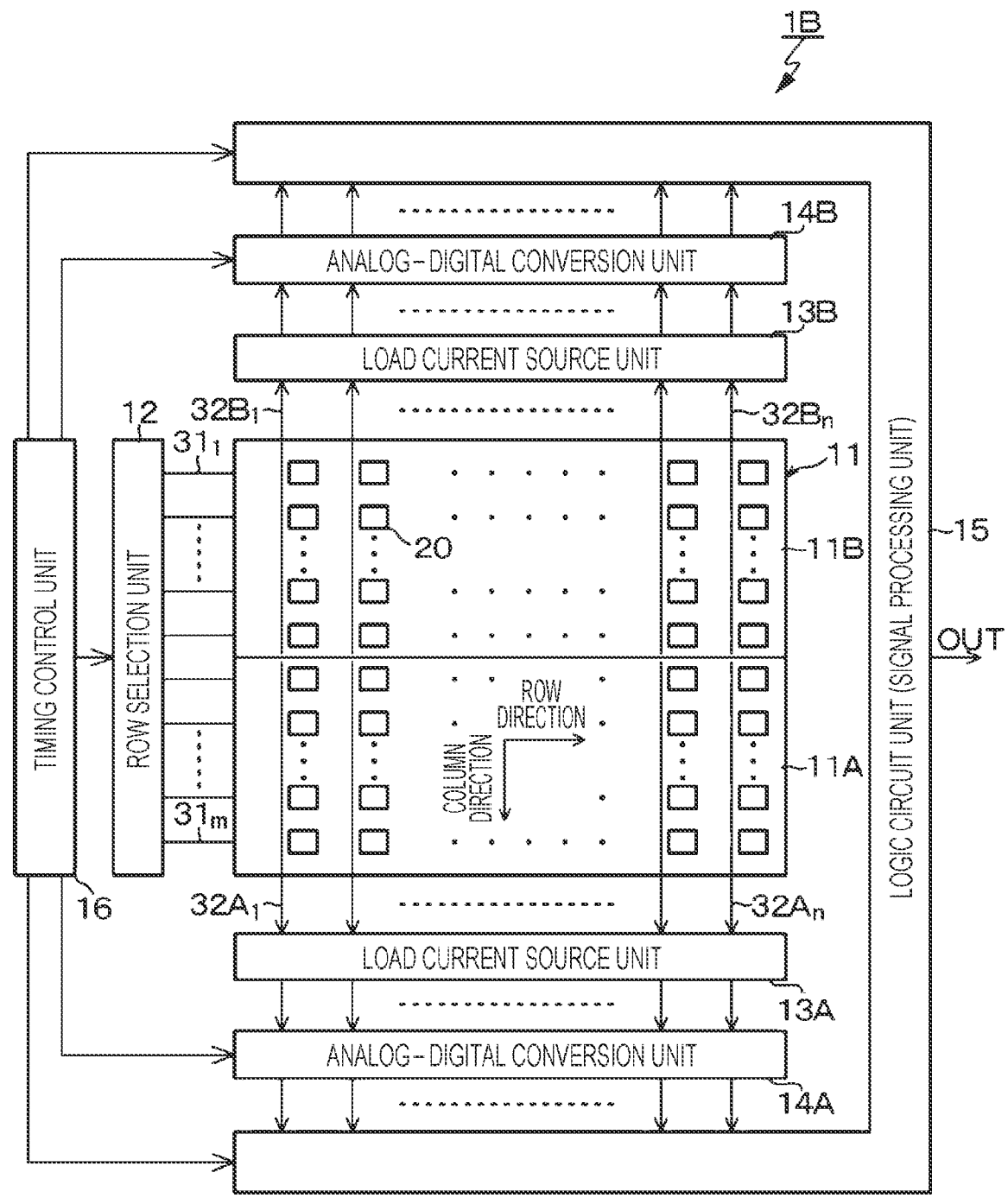
FIG. 10 is a block diagram schematically illustrating an outline of a system configuration of an imaging device according to a second embodiment to which the technology according to the present disclosure is applied.

FIG. 10 is a block diagram schematically illustrating an outline of a system configuration of a CMOS image sensor which is an example of an imaging device according to a second embodiment to which the technology according to the present disclosure is applied.

In a CMOS image sensor 1B according to the second embodiment, the pixel array unit 11 in which the pixels 20 are arranged in a matrix is divided into, for example, two regions 11A and 11B in the column direction. Correspondingly, the signal line 32 is divided into a first signal line 32A ($32A_1$ to $32A_n$) and a second signal line 32B ($32B_1$ to $32B_n$) in the length direction (column direction) for each pixel column.

Furthermore, two systems of load current source units 13 and two systems of analog-digital conversion units 14 are provided to correspond to the two regions 11A and 11B of the pixel array unit 11. Specifically, a load current source unit 13A and an analog-digital conversion unit 14A are provided to correspond to the region 11A of the pixel array unit 11, and a load current source unit 13B and an analog-digital conversion unit 14B are provided to correspond to the region 11B of the pixel array unit 11. The logic circuit unit 15 as a signal processing unit is provided in common for the two regions 11A and 11B of the pixel array unit 11, for example.

A circuit configuration of each pixel 20 in the two regions 11A and 11B of the pixel array unit 11 and a configuration of each analog-digital converter of the analog-digital conversion unit 14 are basically the same as those in the case of the CMOS image sensor 1A according to the first embodiment.

[Stacked Chip Structure]

Figure 11:
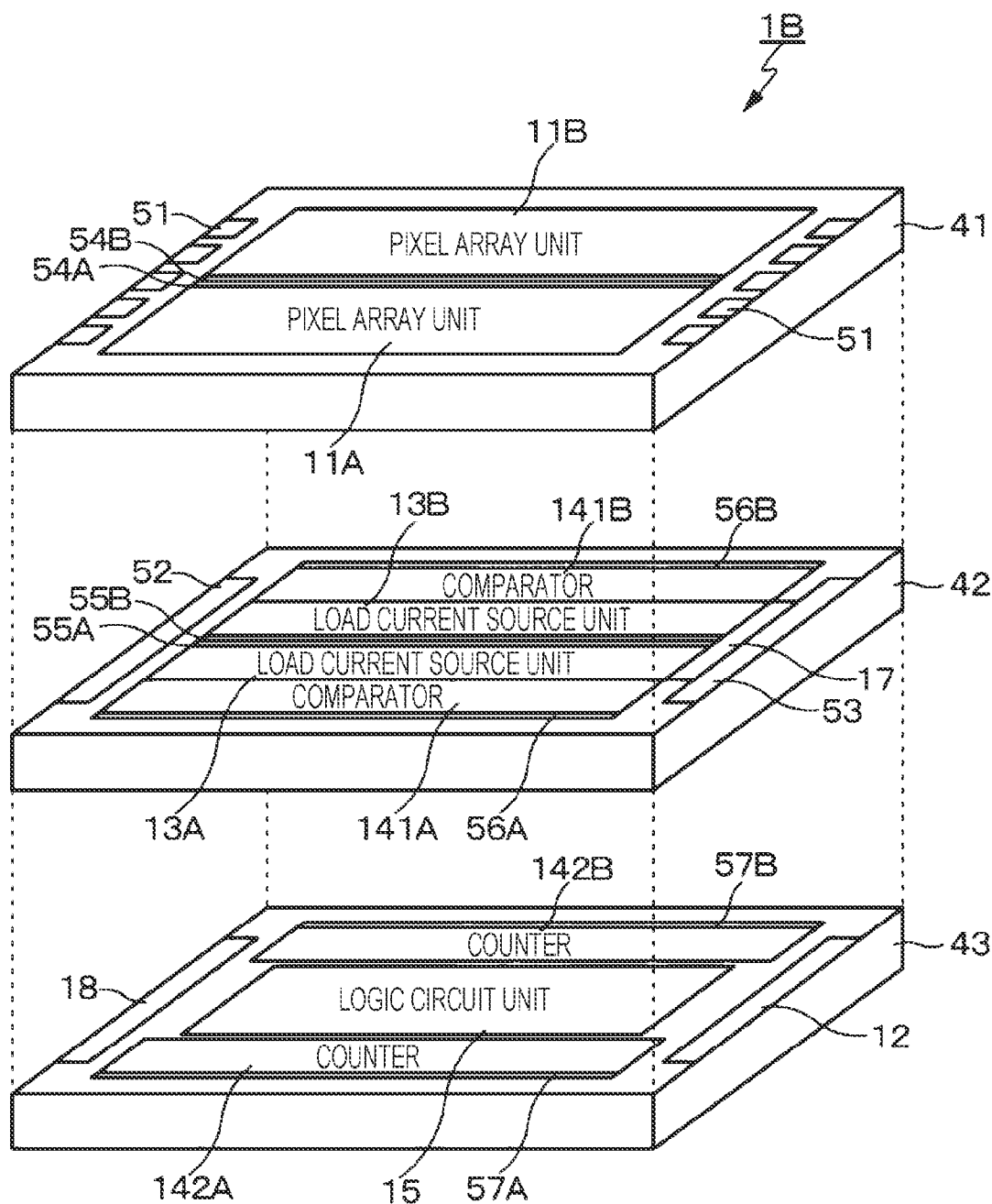
FIG. 11 is a schematic exploded perspective view illustrating a stacked chip structure of a CMOS image sensor according to the second embodiment.

FIG. 11 illustrates a schematic exploded perspective view of a stacked chip structure of the CMOS image sensor 1B according to the second embodiment.

As illustrated in FIG. 11, similarly to the case of the CMOS image sensor 1A according to the first embodiment, the CMOS image sensor 1B according to the second embodiment also has a stacked chip structure in which at least three semiconductor chips such as a semiconductor chip 41 of a first layer, a semiconductor chip 42 of a second layer, and a semiconductor chip 43 of a third layer are stacked.

Then, in the semiconductor chip 41 of the first layer, the two divided regions 11A and 11B of the pixel array unit 11 in which the pixels 20 are two-dimensionally disposed in a matrix are formed with connection portions (VIA) 54A and 54B for electrical connection with the semiconductor chip 42 of the second layer interposed therebetween. Furthermore, for example, pads 51 for external connection and power supply are provided at both left and right ends of the semiconductor chip 41 of the first layer.

An analog circuit unit of the analog-digital conversion unit 14, specifically, comparators 141A and 141B of the analog-digital converter 140 are disposed on the semiconductor chip 42 of the second layer. Load current source units 13A and 13B are further disposed with connection portions (VIA) 55A and 55B for electrical connection with the semiconductor chip 41 of the first layer interposed therebetween on the semiconductor chip 42 of the second layer.

Furthermore, the reference signal generation unit 17 is preferably disposed at a location equidistant from the comparators 141A and 141B on the semiconductor chip 42 of the second layer. Here, the term "equidistance" means to include not only a case where distances are strictly equal but also a case where the distances are substantially equal, and existence of various variations caused by design or manufacturing is allowed.

Note that the disposition of the comparators 141A and 141B of the analog-digital converter 140, the load current source units 13A and 13B, and the reference signal generation unit 17 on the semiconductor chip 42 of the second layer illustrated in FIG. 11 is an example, and is not limited to this disposition example.

A digital circuit unit of the analog-digital conversion unit 14, specifically, counters 142A and 142B of the analog-digital converter 140 are disposed on the semiconductor chip 43 of the third layer. The logic circuit unit 15 which is a signal processing unit, the row selection unit 12, and the interface (I/F) 18 are further disposed on the semiconductor chip 43 of the third layer.

Note that the disposition of the counters 142A and 142B of the analog-digital converter 140, the logic circuit unit 15, the row selection unit 12, and the interface 18 on the semiconductor chip 43 of the third layer illustrated in FIG. 11 is an example, and is not limited to this disposition example.

In the stacked chip structure described above, the signal lines 32A and 32B divided and wired for each pixel column in the two regions 11A and 11B of the semiconductor chip 41 of the first layer, and the circuit units disposed corresponding to the two regions 11A and 11B in the semiconductor chip 42 of the second layer are electrically connected for each pixel column through the connection portions 54A and 54B of the first layer and the connection portions 55A and 55B of the second layer.

More specifically, the first signal line 32A is electrically connected to each of the load current sources I of the load current source unit 13A and the comparator 141A through the connection portion 54A of the first layer and the connection portion 55A of the second layer, which are first connection portions. Furthermore, the second signal line 32B, each load current source I of the load current source unit 13B, and the comparator 141B are electrically connected through the connection portion 54B of the first layer and the connection portion 55B of the second layer, which are second connection portions.

Furthermore, the comparators 141A and 141B disposed corresponding to the two regions 11A and 11B on the semiconductor chip 42 of the second layer and the counters 142A and 142B disposed on the semiconductor chip 43 of the third layer are electrically connected for each pixel column through the connection portions 56A and 56B of the second layer and the connection portions 57A and 57B of the third layer. Examples of the connection portions 54A and 54B, the connection portions 55A and 55B, the connection portions 56A and 56B, and the connection portions 57A and 57B include a through silicon via (TSV), a metal-metal junction including a Cu—Cu junction, and the like.

Note that, in the above example, the case where the stacked chip structure is a stacked structure of three layers has been exemplified, but the stacked chip structure is not limited to the stacked structure of three layers, and may be a stacked structure of four or more layers. In a case of a stacked structure of four or more layers, the analog circuit unit and the digital circuit unit of the analog-digital conversion unit 14 can be distributed and disposed on the semiconductor chips of the second and subsequent layers.

[Electrical Connection Structure Between Semiconductor Chips]

Next, electrical connection structures between the semiconductor chip 41 of the first layer and the semiconductor chip 42 of the second layer and between the semiconductor chip 42 of the second layer and the semiconductor chip 43 of the third layer will be described.

Electrical Connection Structure Example 1

Figure 12A:
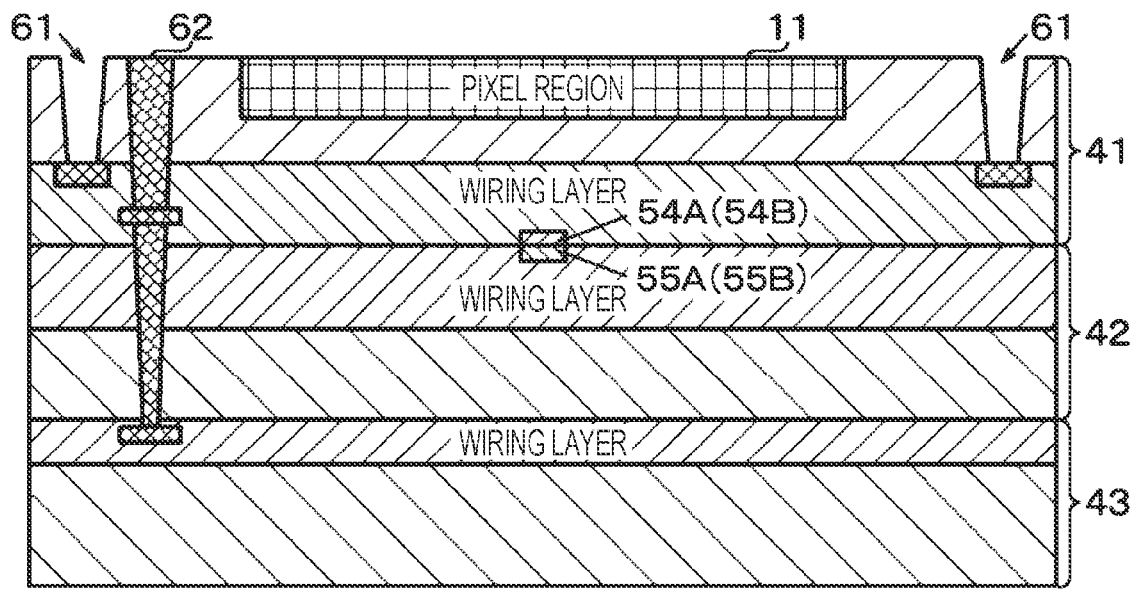
FIG. 12A is an end view of a cut portion illustrating an electrical connection structure example 1 between semiconductor chips.

FIG. 12A illustrates an end view of a cut portion in the case of the electrical connection structure example 1 between semiconductor chips. The electrical connection structure example 1 is an example of using a through silicon via (TSV) as an electrical connection portion between semiconductor chips. As illustrated in FIG. 12A, openings 61 for the pads 51 for external connection or power supply are formed at both left and right ends of the semiconductor chip 41 of the first layer in which the pixel array unit (pixel region) 11 is formed.

Then, in the electrical connection structure example 1, a through silicon via 62 is used as an electrical connection portion between the semiconductor chips 41 of the first layer, the semiconductor chip 42 of the second layer, and the semiconductor chip 43 of the third layer. Furthermore, the connection portions 54A (54B) and 55A (55B) for performing electrical connection between the semiconductor chips 41 of the first layer and the semiconductor chip 42 of the second layer are provided close to each other in the pixel array unit 11. A Cu—Cu junction (direct bonding using a Cu electrode) is used as the connection portions 54A (54B) and 55A (55B) in the pixel array unit 11.

Electrical Connection Structure Example 2

Figure 12B:
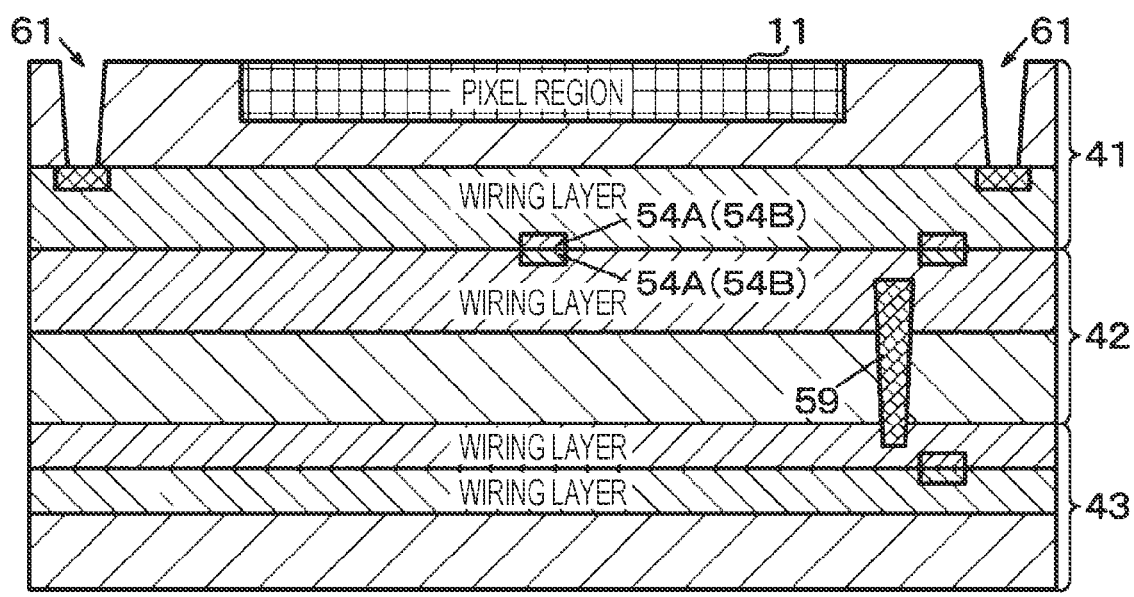
FIG. 12B is an end view of a cut portion illustrating an electrical connection structure example 2 between semiconductor chips.

FIG. 12B illustrates an end view of a cut portion in a case of an electrical connection structure example 2 between semiconductor chips. In the electrical connection structure example 2, Cu—Cu junctions are used as the connection portion 54A (54B) and 55A (55B) in the pixel array unit 11 between the semiconductor chips 41 of the first layer and the semiconductor chip 42 of the second layer. For a connection portion outside the pixel array unit 11 between the semiconductor chips 42 of the second layer and the semiconductor chip 43 of the third layer, the through silicon via 62 may be used, or a Cu—Cu junction may be used.

As described above, according to the CMOS image sensor 1B according to the second embodiment, the stacked chip structure has a stacked structure of three or more layers, and the analog circuit unit and the digital circuit unit of the analog-digital conversion unit 14 are disposed on semiconductor chips of different layers, so that it is possible to achieve operations and effects similar to those in the case of the CMOS image sensor 1A according to the first embodiment.

That is, it is possible to increase the number of parallel analog-digital converters 140 while maintaining a chip size in which the contribution of the semiconductor chip 41 of the first layer in which the pixel array unit 11 is formed is dominant, and thus to improve a frame rate. Furthermore, a process suitable for manufacturing the pixel 20 can be applied to the semiconductor chip 41 of the first layer.

Furthermore, in the case of the above example, a low-cost process (for example, 55 nm process) suitable for manufacturing the analog circuit unit of the analog-digital conversion unit 14 can be applied to the semiconductor chip 42 of the second layer, and a process (for example, 22 nm process) suitable for manufacturing the digital circuit unit of the analog-digital conversion unit 14 can be applied to the semiconductor chip 43 of the third layer, so that the characteristics and cost can be optimized. In particular, an advanced process can be applied to manufacturing of the digital circuit unit.

Furthermore, in the CMOS image sensor 1B according to the second embodiment, the pixel array unit 11 is divided into a plurality of regions in the column direction, and correspondingly, the signal line 32 is divided into a plurality of signal lines in the length direction for each pixel column. Therefore, the following operations and effects can be achieved.

Figure 13:
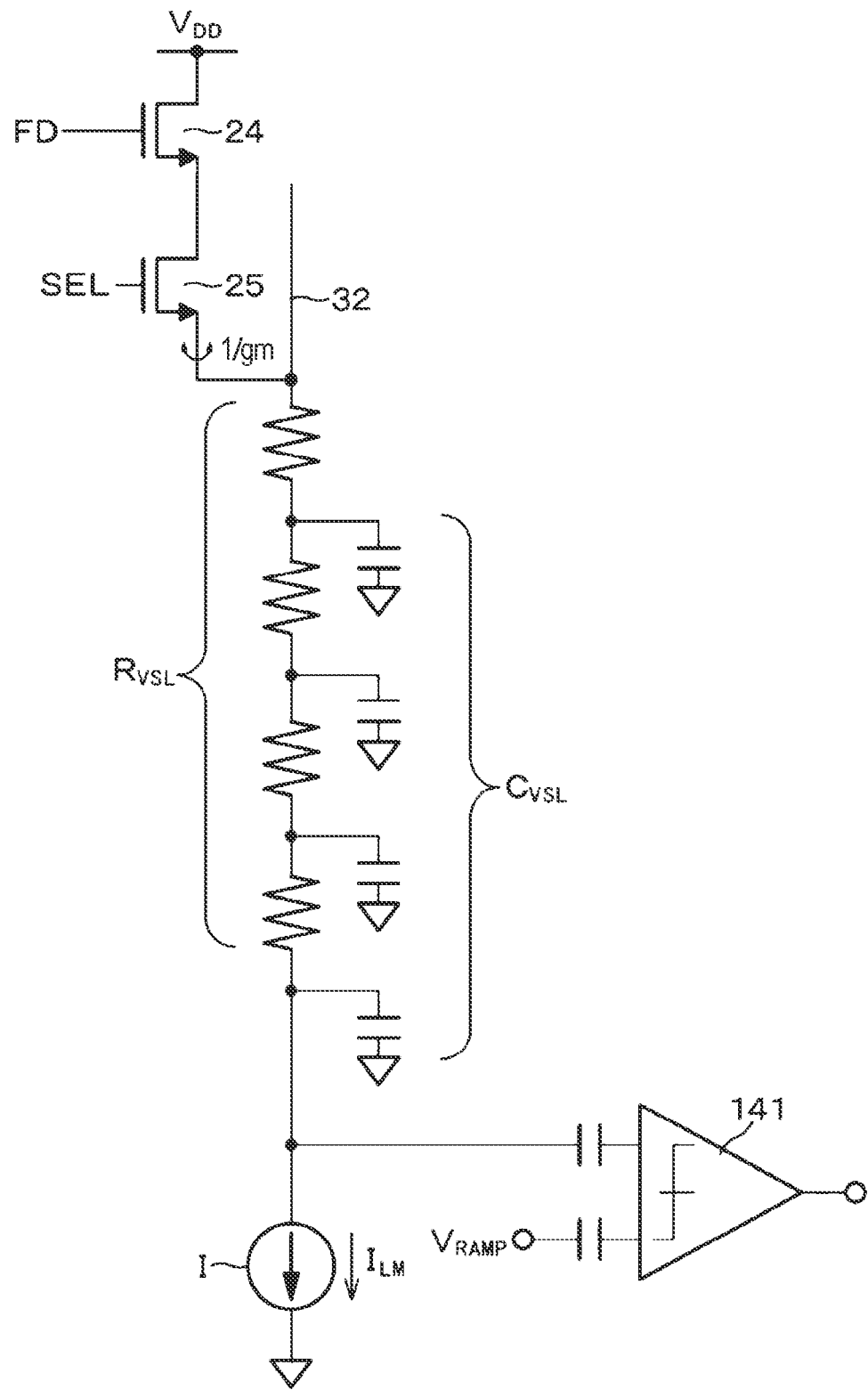
FIG. 13 is an explanatory diagram of parasitic resistance and parasitic capacitance of a signal line.

As illustrated in FIG. 13, when a parasitic resistance of the signal line 32 is $R_{VSL}$, a parasitic capacitance is $C_{VSL}$, a current flowing through the load current source I is $I_{LM}$, and a transconductance of the MOS transistor is $g_m$, the pixel P-phase/D-phase settling time is determined by $1/g_m$ ($\propto 1/\sqrt{I_{LM}}$), the parasitic resistance $R_{VSL}$, and the parasitic capacitance $C_{VSL}$. By dividing the signal line 32 into a plurality of signal lines, the parasitic resistance $R_{VSL}$ and the parasitic capacitance $C_{VSL}$ of one signal line can be reduced. For example, in a case where the signal line 32 is divided into two, the parasitic resistance $R_{VSL}$ and the parasitic capacitance $C_{VSL}$ can be halved.

Figure 14:
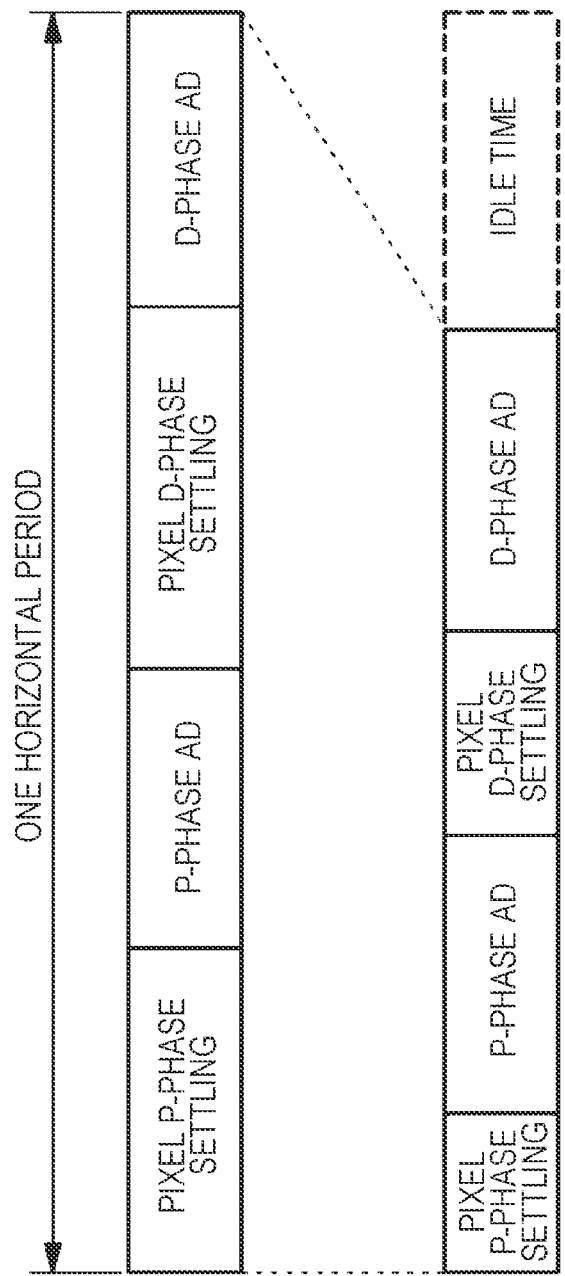
FIG. 14 is an explanatory diagram illustrating reduction in power consumption accompanying halving of parasitic resistance and parasitic capacitance of a signal line.

FIG. 14 is a timing chart for one horizontal period (1H). In a case where the parasitic resistance $R_{VSL}$ and the parasitic capacitance $C_{VSL}$ can be halved, the pixel P-phase/D-phase settling time (settling time of the signal line potential) can be shortened, so that the time required for reading pixel signals of one row can be shortened, and thus a frame rate can be improved. Furthermore, since the settling time can be shortened, an idle time occurs within one horizontal period as illustrated in FIG. 14, and thus the power consumption can be reduced by stopping a circuit operation during the idle time. Alternatively, the current $I_{LM}$ flowing to the load current source I may be reduced by an amount of decrease in the parasitic resistance $R_{VSL}$ and the parasitic capacitance $C_{VSL}$ while maintaining the same one horizontal period without shortening the settling time.

<Imaging Device According to Third Embodiment>

The imaging device according to the second embodiment has a configuration in which the analog circuit unit of the analog-digital conversion unit 14 is formed in the semiconductor chip 42 of the second layer and the digital circuit unit of the analog-digital conversion unit 14 is formed in the semiconductor chip 43 of the third layer. In contrast, an imaging device according to a third embodiment has a configuration in which the digital circuit unit of the analog-digital conversion unit 14 is formed in the semiconductor chip 42 of the second layer and the analog circuit unit of the analog-digital conversion unit 14 is formed in the semiconductor chip 43 of the third layer.

Configuration Example of CMOS Image Sensor

Figure 15:
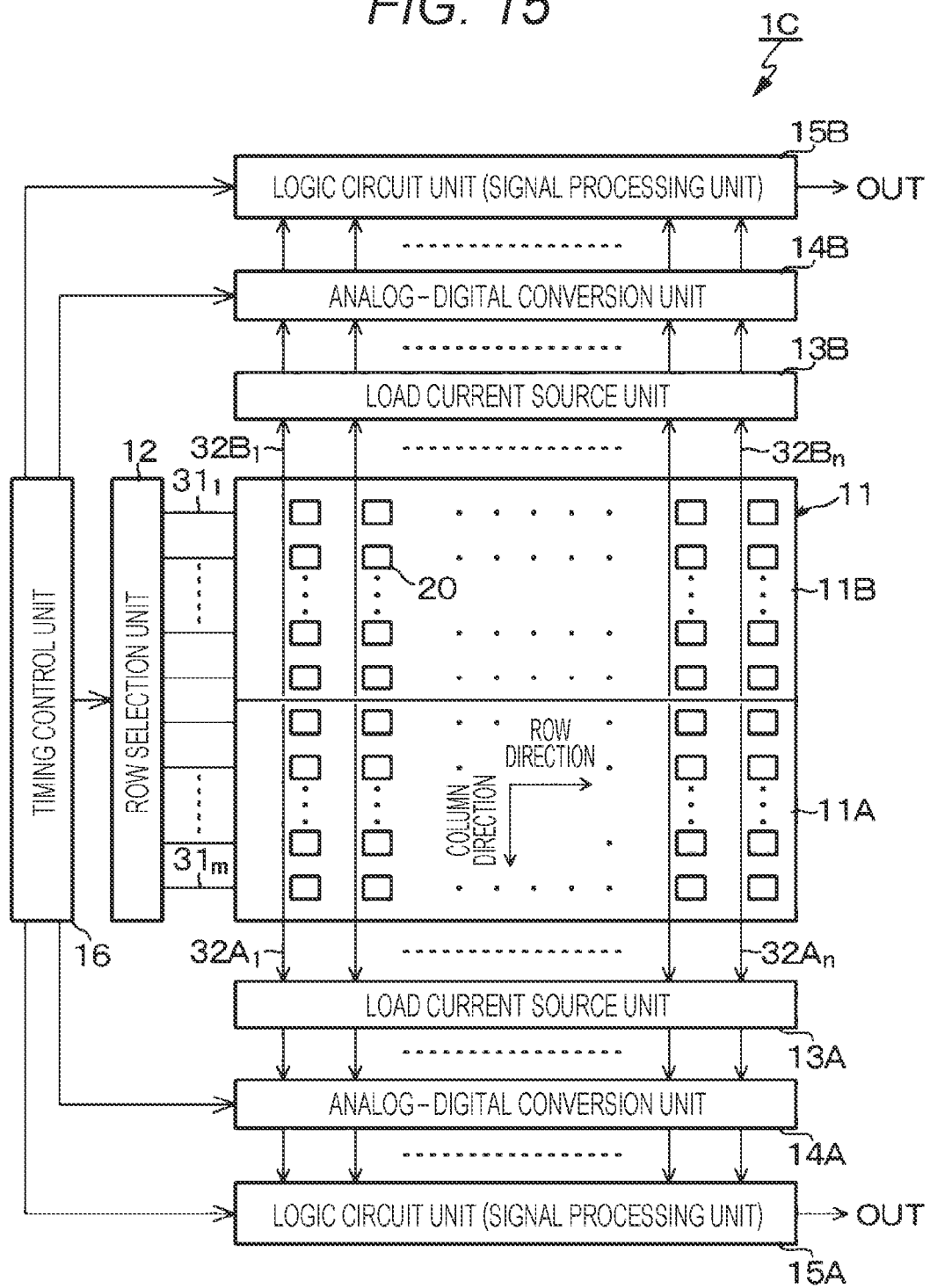
FIG. 15 is a block diagram schematically illustrating an outline of a system configuration of an imaging device according to a third embodiment to which the technology according to the present disclosure is applied.

FIG. 15 is a block diagram schematically illustrating an outline of a system configuration of a CMOS image sensor which is an example of an imaging device according to a third embodiment to which the technology according to the present disclosure is applied.

A CMOS image sensor 1C according to the third embodiment is the same as the case of the second embodiment in that the pixel array unit 11 is divided into two regions 11A and 11B in the column direction, and correspondingly, the signal line 32 is divided into the first signal line 32A ($32A_1$ to $32A_n$) and the second signal line 32B ($32B_1$ to $32B_n$) for each pixel column.

Furthermore, two systems of load current source units 13, two systems of analog-digital conversion units 14, and two systems of logic circuit units 15 as signal processing units are provided to correspond to the two regions 11A and 11B of the pixel array unit 11. Specifically, the load current source unit 13A, the analog-digital conversion unit 14A, and the logic circuit unit 15A are provided to correspond to the region 11A of the pixel array unit 11, and the load current source unit 13B, the analog-digital conversion unit 14B, and the logic circuit unit 15B are provided to correspond to the region 11B of the pixel array unit 11.

A circuit configuration of each pixel 20 in the two regions 11A and 11B of the pixel array unit 11 and a configuration of each analog-digital converter of the analog-digital conversion unit 14 are basically the same as those in the case of the CMOS image sensor 1A according to the first embodiment.

[Stacked Chip Structure]

Figure 16:
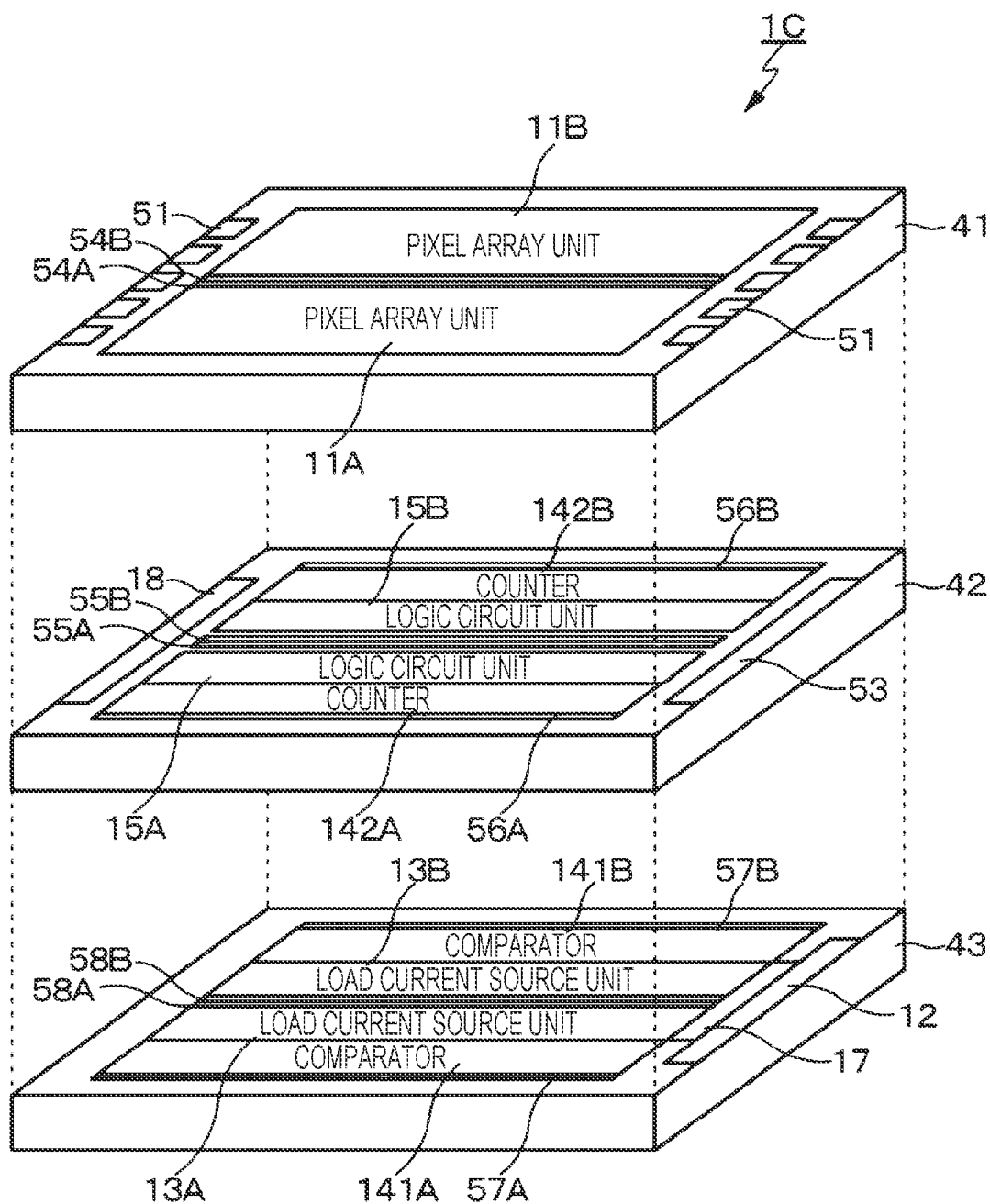
FIG. 16 is a schematic exploded perspective view illustrating a stacked chip structure of a CMOS image sensor according to the third embodiment.

FIG. 16 illustrates a schematic exploded perspective view of a stacked chip structure of a CMOS image sensor 1C according to the third embodiment.

As illustrated in FIG. 16, similarly to the case of the CMOS image sensor 1A according to the first embodiment, the CMOS image sensor 1C according to the third embodiment also has a stacked chip structure in which at least three semiconductor chips such as a semiconductor chip 41 of a first layer, a semiconductor chip 42 of a second layer, and a semiconductor chip 43 of a third layer are stacked.

Then, in the semiconductor chip 41 of the first layer, the two divided regions 11A and 11B of the pixel array unit 11 in which the pixels 20 are two-dimensionally disposed in a matrix are formed with connection portions (VIA) 54A and 54B for electrical connection with the semiconductor chip 42 of the second layer interposed therebetween. Furthermore, for example, pads 51 for external connection and power supply are provided at both left and right ends of the semiconductor chip 41 of the first layer.

A digital circuit unit of the analog-digital conversion unit 14, specifically, the counters 142A and 142B of the analog-digital converter 140 are disposed on the semiconductor chip 42 of the second layer. The connection portions 56A and 56B for electrical connection with the semiconductor chip 43 of the third layer are provided outside the counters 142A and 142B.

The logic circuit units 15A and 15B that are signal processing units are disposed on the semiconductor chip 42 of the second layer in addition to the digital circuit unit of the analog-digital conversion unit 14. The connection portions 55A and 55B that relay electrical connection between the semiconductor chip 41 of the first layer and the semiconductor chip 42 of the second layer are provided between the logic circuit units 15A and 15B. The interface (I/F) 18 is further disposed on the semiconductor chip 42 of the second layer.

Note that the disposition of the counters 142A and 142B of the analog-digital converter 140, the logic circuit units 15A and 15B, and the interface 18 on the semiconductor chip 42 of the second layer illustrated in FIG. 16 is an example, and is not limited to this disposition example.

An analog circuit unit of the analog-digital conversion unit 14, specifically, the comparators 141A and 141B of the analog-digital converter 140 are disposed on the semiconductor chip 43 of the third layer. The connection portions 57A and 57B for electrical connection with the semiconductor chip 42 of the second layer are provided outside the comparators 141A and 141B.

On the semiconductor chip 43 of the third layer, in addition to the comparators 141A and 141B, the load current source units 13A and 13B are disposed with the connection portions (VIA) 58A and 58B that perform electrical connection with the semiconductor chip 41 of the first layer via the connection portions 55A and 55B of the semiconductor chip 42 of the second layer interposed therebetween. The row selection unit 12 is further disposed on the semiconductor chip 43 of the third layer. Furthermore, the reference signal generation unit 17 is preferably disposed at a location equidistant from the comparators 141A and 141B on the semiconductor chip 43 of the third layer.

Note that the disposition of the comparators 141A and 141B of the analog-digital converter 140, the load current source units 13A and 13B, the row selection unit 12, and the reference signal generation unit 17 on the semiconductor chip 43 of the third layer illustrated in FIG. 16 is an example, and is not limited to this disposition example.

In the stacked chip structure described above, the signal lines 32A and 32B divided and wired for each pixel column in the semiconductor chip 41 of the first layer and the load current sources I of the load current source units 13A and 13B disposed on the semiconductor chip 43 of the third layer are electrically connected for each pixel column through the connection portions 54A and 54B of the first layer, the connection portions 55A and 55B of the second layer, and the connection portions 58A and 58B of the third layer.

Furthermore, the counters 142A and 142B disposed corresponding to the two regions 11A and 11B on the semiconductor chip 42 of the second layer and the comparators 141A and 141B disposed on the semiconductor chip 43 of the third layer are electrically connected for each pixel column through the connection portions 56A and 56B of the second layer and the connection portions 57A and 57B of the third layer. Examples of the connection portions 54A and 54B, the connection portions 55A and 55B, the connection portions 56A and 56B, the connection portions 57A and 57B, and the connection portions 58A and 58B include a through silicon via (TSV), a metal-metal junction including a Cu—Cu junction, and the like.

Note that, in the above example, the case where the stacked chip structure is a stacked structure of three layers has been exemplified, but the stacked chip structure is not limited to the stacked structure of three layers, and may be a stacked structure of four or more layers. In a case of a stacked structure of four or more layers, the analog circuit unit and the digital circuit unit of the analog-digital conversion unit 14 can be distributed and disposed on the semiconductor chips of the second and subsequent layers.

As described above, in the CMOS image sensor 1C according to the third embodiment, the stacked chip structure has a stacked structure of three or more layers, and the analog circuit unit and the digital circuit unit of the analog-digital conversion unit 14 are formed on semiconductor chips of different layers, so that it is possible to achieve operations and effects similar to those in the case of the CMOS image sensor 1A according to the first embodiment.

That is, it is possible to increase the number of parallel analog-digital converters 140 while maintaining a chip size in which the contribution of the semiconductor chip 41 of the first layer in which the pixel array unit 11 is formed is dominant, and thus to improve a frame rate. Furthermore, a process suitable for manufacturing the pixel 20 can be applied to the semiconductor chip 41 of the first layer.

Furthermore, in the case of the above example, a process suitable for manufacturing the digital circuit unit of the analog-digital conversion unit 14 (for example, 22 nm process) can be applied to the semiconductor chip 42 of the second layer, and a low-cost process suitable for manufacturing the analog circuit unit of the analog-digital conversion unit 14 (for example, 55 nm process) can be applied to the semiconductor chip 43 of the third layer, so that the characteristics and cost can be optimized. In particular, an advanced process can be applied to manufacturing of the digital circuit unit.

Furthermore, in the CMOS image sensor 1C according to the third embodiment, since the signal line 32 is divided into a plurality of signal lines in the length direction thereof, it is possible to achieve operations and effects similar to those in the case of the CMOS image sensor 1B according to the second embodiment. That is, since the parasitic resistance $R_{VSL}$ and the parasitic capacitance $C_{VSL}$ of one signal line can be reduced, the settling time of the signal line potential can be shortened, and, as a result, the time required for reading pixel signals of one row can be shortened, and thus a frame rate can be improved.

Furthermore, since the settling time can be shortened, an idle time occurs within one horizontal period, and thus the power consumption can be reduced by stopping a circuit operation during the idle time. Alternatively, the current $I_{LM}$ flowing to the load current source I may be reduced by the amount of decrease in the parasitic resistance $R_{VSL}$ and the parasitic capacitance $C_{VSL}$ while maintaining the same one horizontal period without shortening the settling time.

Furthermore, in the case of the CMOS image sensor 1C according to the third embodiment, since the interface 18 is provided in the semiconductor chip 42 of the second layer, the parasitic resistance and the parasitic capacitance associated with an output of the interface 18 can be reduced compared with the case of being provided in the semiconductor chip 43 of the third layer. The output of the interface 18 is a high-speed signal, and it is important in terms of design that the parasitic resistance and the parasitic capacitance for one layer can be reduced.

<Imaging Device According to Fourth Embodiment>

A fourth embodiment is a modification example of the second embodiment, and is an example in which a memory region is secured in the semiconductor chip of the third layer.

Figure 17:
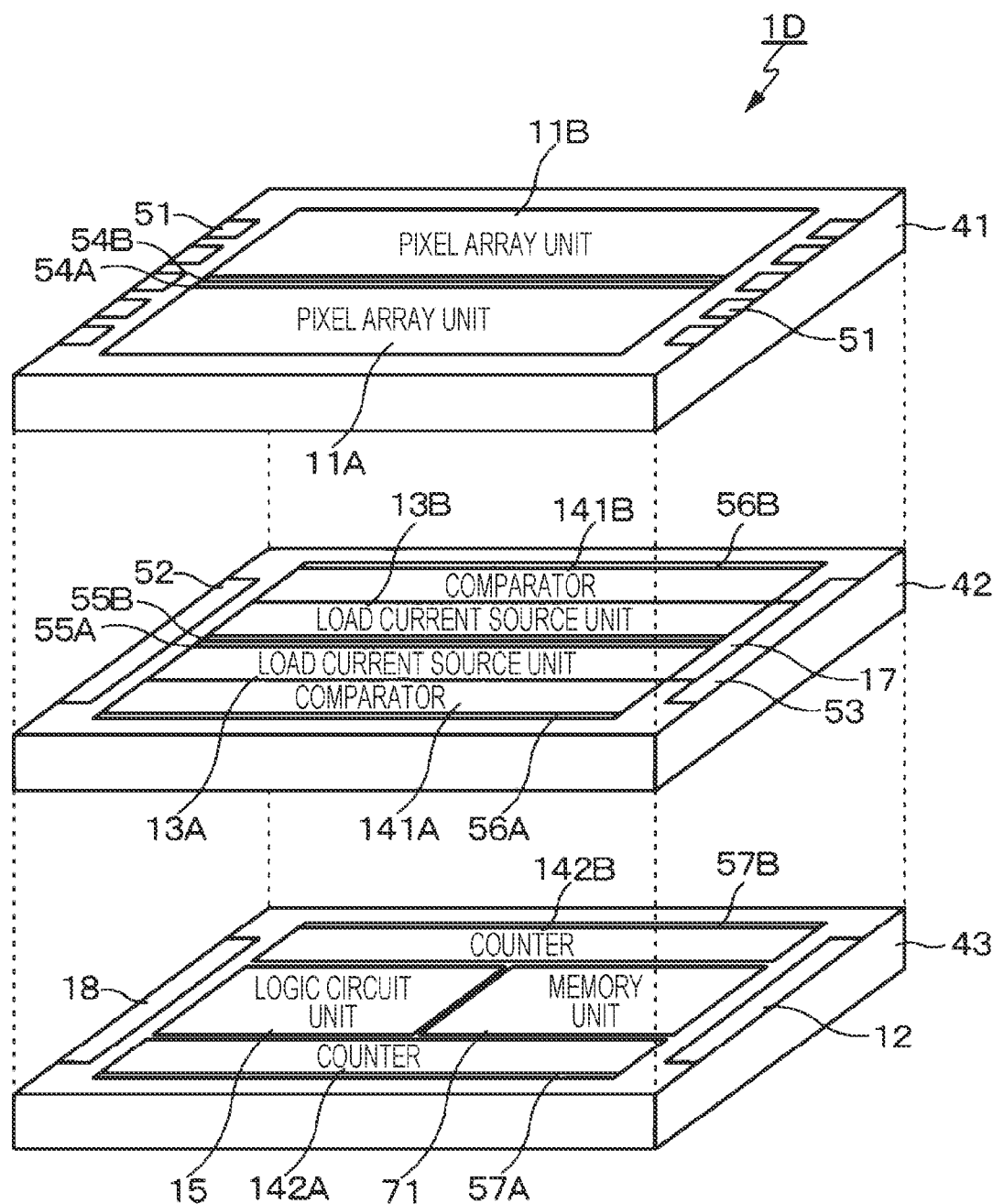
FIG. 17 is a schematic exploded perspective view illustrating a stacked chip structure of a CMOS image sensor according to a fourth embodiment.

FIG. 17 illustrates a schematic exploded perspective view of a stacked chip structure of a CMOS image sensor as an example of an imaging device according to the fourth embodiment to which the technology according to the present disclosure is applied.

In the stacked chip structure in which at least three semiconductor chips such as a semiconductor chip 41 of a first layer, a semiconductor chip 42 of a second layer, and a semiconductor chip 43 of a third layer are stacked, configurations of the semiconductor chip 41 of the first layer and the semiconductor chip 42 of the second layer are the same as in the case of the CMOS image sensor 1B according to the second embodiment.

The CMOS image sensor 1D according to the fourth embodiment has a configuration in which a memory unit 71 is disposed on the semiconductor chip 43 of the third layer in addition to the counters 142A and 142B which are digital circuit units of the analog-digital conversion unit 14, the logic circuit unit 15 which is a signal processing unit, the row selection unit 12, and the interface 18. The memory unit 71 may be used, for example, to temporarily store data during desired signal processing in the logic circuit unit 15.

<Imaging Device According to Fifth Embodiment>

A fifth embodiment is a modification example of the fourth embodiment, and is an example in which an artificial intelligence (AI) region is secured instead of a memory region in the semiconductor chip of the third layer.

Figure 18:
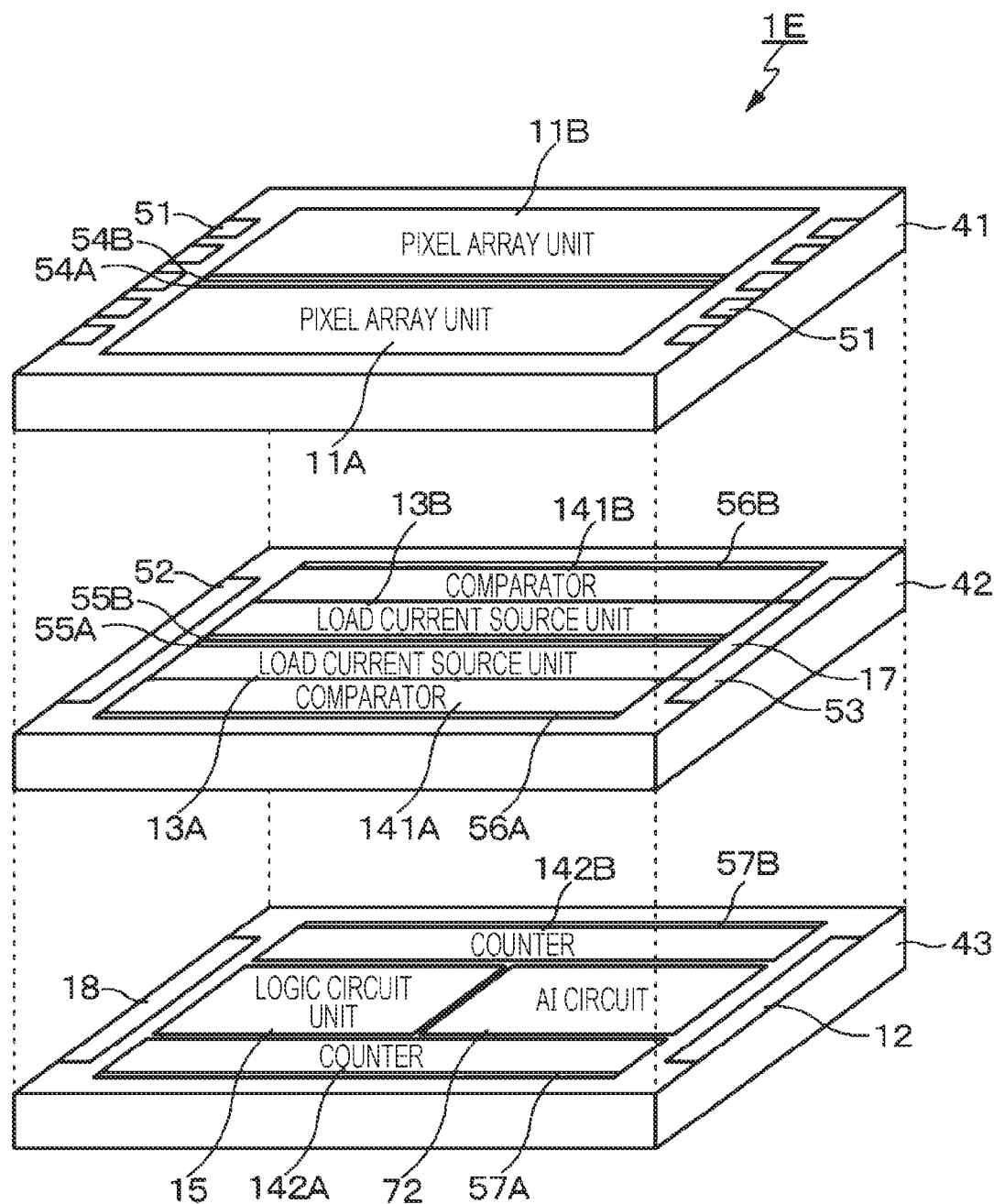
FIG. 18 is a schematic exploded perspective view illustrating a stacked chip structure of a CMOS image sensor according to a fifth embodiment.

FIG. 18 illustrates a schematic exploded perspective view of a stacked chip structure of a CMOS image sensor as an example of an imaging device according to the fifth embodiment to which the technology according to the present disclosure is applied.

In the stacked chip structure in which at least three semiconductor chips such as a semiconductor chip 41 of a first layer, a semiconductor chip 42 of a second layer, and a semiconductor chip 43 of a third layer are stacked, configurations of the semiconductor chip 41 of the first layer and the semiconductor chip 42 of the second layer are the same as in the case of the CMOS image sensor 1B according to the second embodiment.

A CMOS image sensor 1E according to the fifth embodiment has a configuration in which an AI circuit 72 is disposed on the semiconductor chip 43 of the third layer in addition to the counters 142A and 142B which are digital circuit units of the analog-digital conversion unit 14, the logic circuit unit 15 which is a signal processing unit, the row selection unit 12, and the interface 18. The AI circuit 72 may be used for, for example, image processing, various settings for analog signals, and the like.

<Imaging Device According to Sixth Embodiment>

A sixth embodiment is a modification example of the second embodiment, and is an example of a stacked structure in which a stacked chip structure has four layers.

Figure 19:
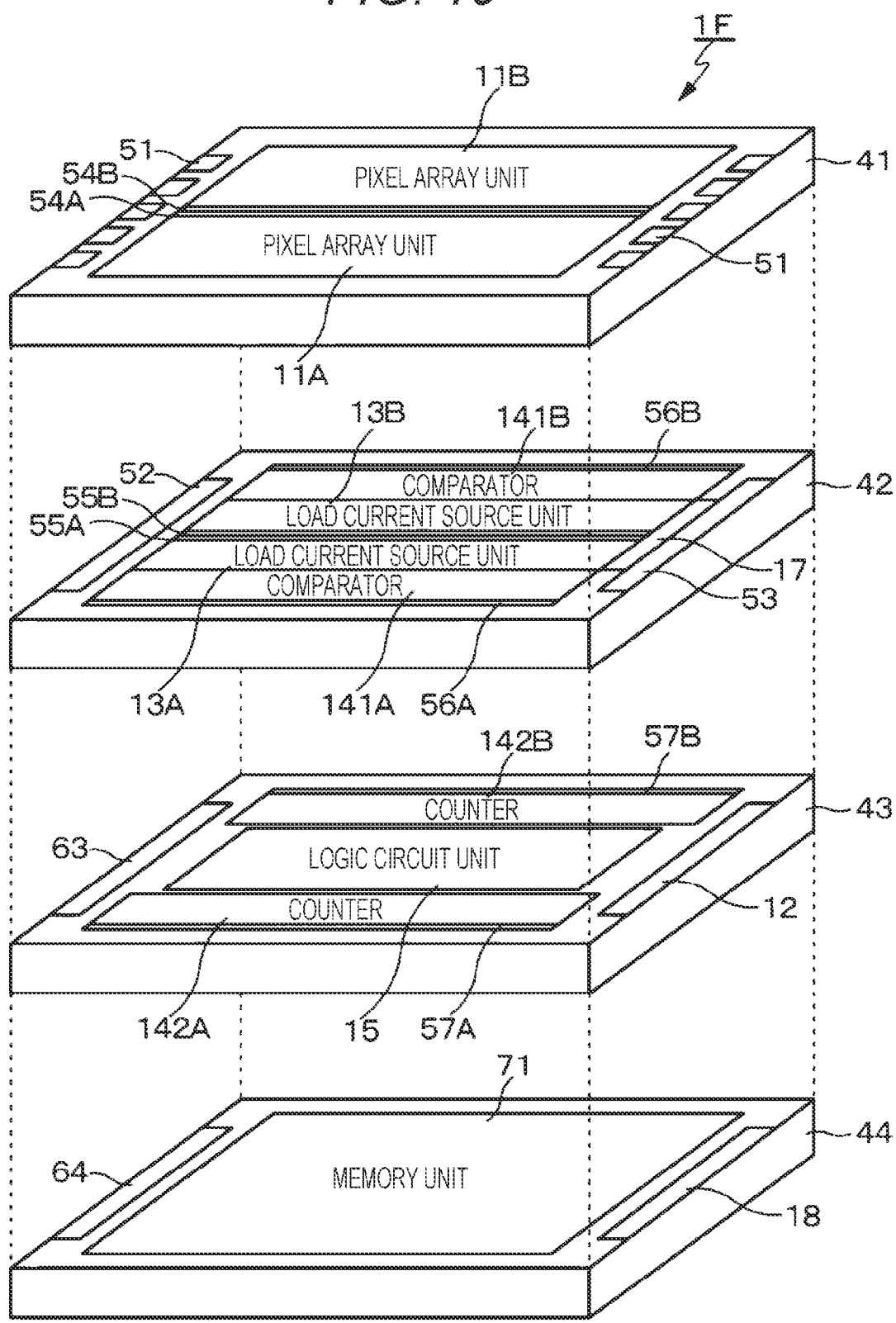
FIG. 19 is a schematic exploded perspective view illustrating a stacked chip structure of a CMOS image sensor according to a sixth embodiment.

FIG. 19 illustrates a schematic exploded perspective view of a stacked chip structure of a CMOS image sensor as an example of an imaging device according to the sixth embodiment to which the technology according to the present disclosure is applied.

As illustrated in FIG. 19, a CMOS image sensor 1F according to the sixth embodiment has a stacked chip structure in which four semiconductor chips such as a semiconductor chip 41 of a first layer, a semiconductor chip 42 of a second layer, a semiconductor chip 43 of a third layer, and a semiconductor chip 44 of a fourth layer are stacked.

Configurations of the semiconductor chip 41 of the first layer, the semiconductor chip 42 of the second layer, and the semiconductor chip 43 of the third layer are similar to those in the case of the CMOS image sensor 1B according to the second embodiment. That is, the two divided regions 11A and 11B of the pixel array unit 11 and the like are formed in the semiconductor chip 41 of the first layer, and the comparators 141A and 141B of the analog-digital converter 140, the load current source units 13A and 13B, the reference signal generation unit 17, and the like are disposed on the semiconductor chip 42 of the second layer. The semiconductor chip 41 of the first layer and the semiconductor chip 42 of the second layer are electrically connected through the connection portions 54A and 54B of the first layer and the connection portions 55A and 55B of the second layer.

The counters 142A and 142B of the analog-digital converter 140, the logic circuit unit 15, and the row selection unit 12 are disposed on the semiconductor chip 43 of the third layer. The comparators 141A and 141B on the semiconductor chip 42 of the second layer and the counters 142A and 142B on the semiconductor chip 43 of the third layer are electrically connected through the connection portions 56A and 56B of the second layer and the connection portions 57A and 57B of the third layer.

The memory unit 71 and the interface 18 are disposed on the semiconductor chip 44 of the fourth layer. The semiconductor chip 43 of the third layer and the semiconductor chip 44 of the fourth layer are connected by, for example, chip on wafer (CoW). The logic circuit unit 15 on the semiconductor chip 43 of the third layer and the memory unit 71 on the semiconductor chip 44 of the fourth layer are electrically connected through the connection portion 63 of the third layer and the connection portion 64 of the fourth layer. The memory unit 71 may be used, for example, to temporarily store data during desired signal processing in the logic circuit unit 15.

<Imaging Device According to Seventh Embodiment>

A seventh embodiment is a modification example of the sixth embodiment, and is an example in which an AI region is secured instead of a memory region in a semiconductor chip of a fourth layer.

Figure 20:
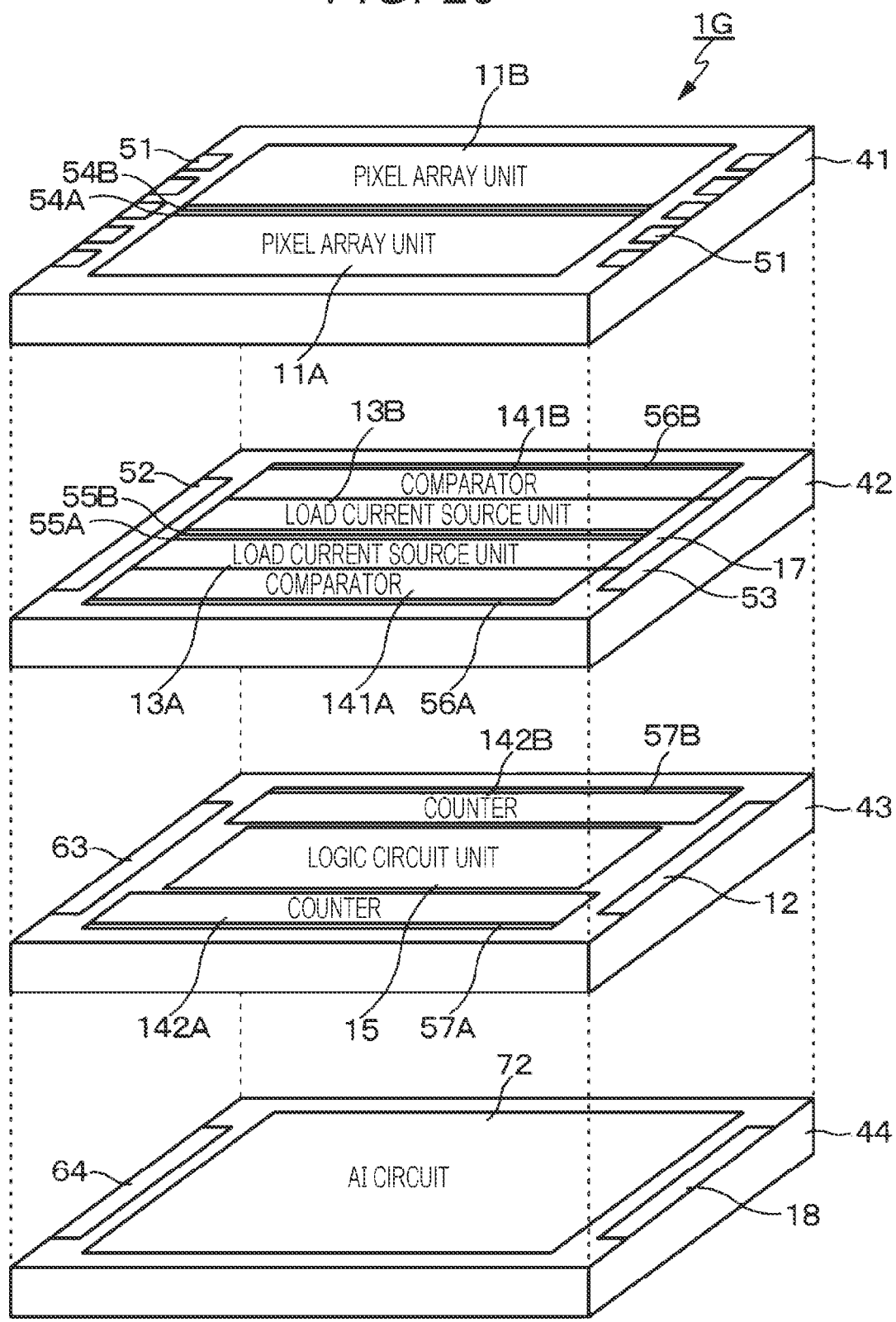
FIG. 20 is a schematic exploded perspective view illustrating a stacked chip structure of a CMOS image sensor according to a seventh embodiment.

FIG. 20 illustrates a schematic exploded perspective view of a stacked chip structure of a CMOS image sensor as an example of an imaging device according to the seventh embodiment to which the technology according to the present disclosure is applied.

As illustrated in FIG. 20, similarly to the CMOS image sensor 1E according to the sixth embodiment, a CMOS image sensor 1G according to the seventh embodiment also has a stacked chip structure in which four semiconductor chips such as a semiconductor chip 41 of a first layer, a semiconductor chip 42 of a second layer, a semiconductor chip 43 of a third layer, and a semiconductor chip 44 of a fourth layer are stacked.

In the stacked chip structure described above, configurations of the semiconductor chip 41 of the first layer, the semiconductor chip 42 of the second layer, and the semiconductor chip 43 of the third layer are the same as those in the case of the CMOS image sensor 1F according to the sixth embodiment. Then, an AI circuit 72 is disposed on the semiconductor chip 44 of the fourth layer instead of the memory unit 71. The semiconductor chip 43 of the third layer and the semiconductor chip 44 of the fourth layer are, for example, connected by CoW, and the logic circuit unit 15 on the semiconductor chip 43 of the third layer and the AI circuit 72 on the semiconductor chip 44 of the fourth layer are electrically connected through the connection portion 63 of the third layer and the connection portion 64 of the fourth layer. The AI circuit 72 may be used for, for example, image processing, various settings for analog signals, and the like.

<Imaging Device According to Eighth Embodiment>

An eighth embodiment is a modification example of the seventh embodiment, and is an example in which a size of the semiconductor chip of the fourth layer is made smaller than sizes of the other semiconductor chips.

Figure 21:
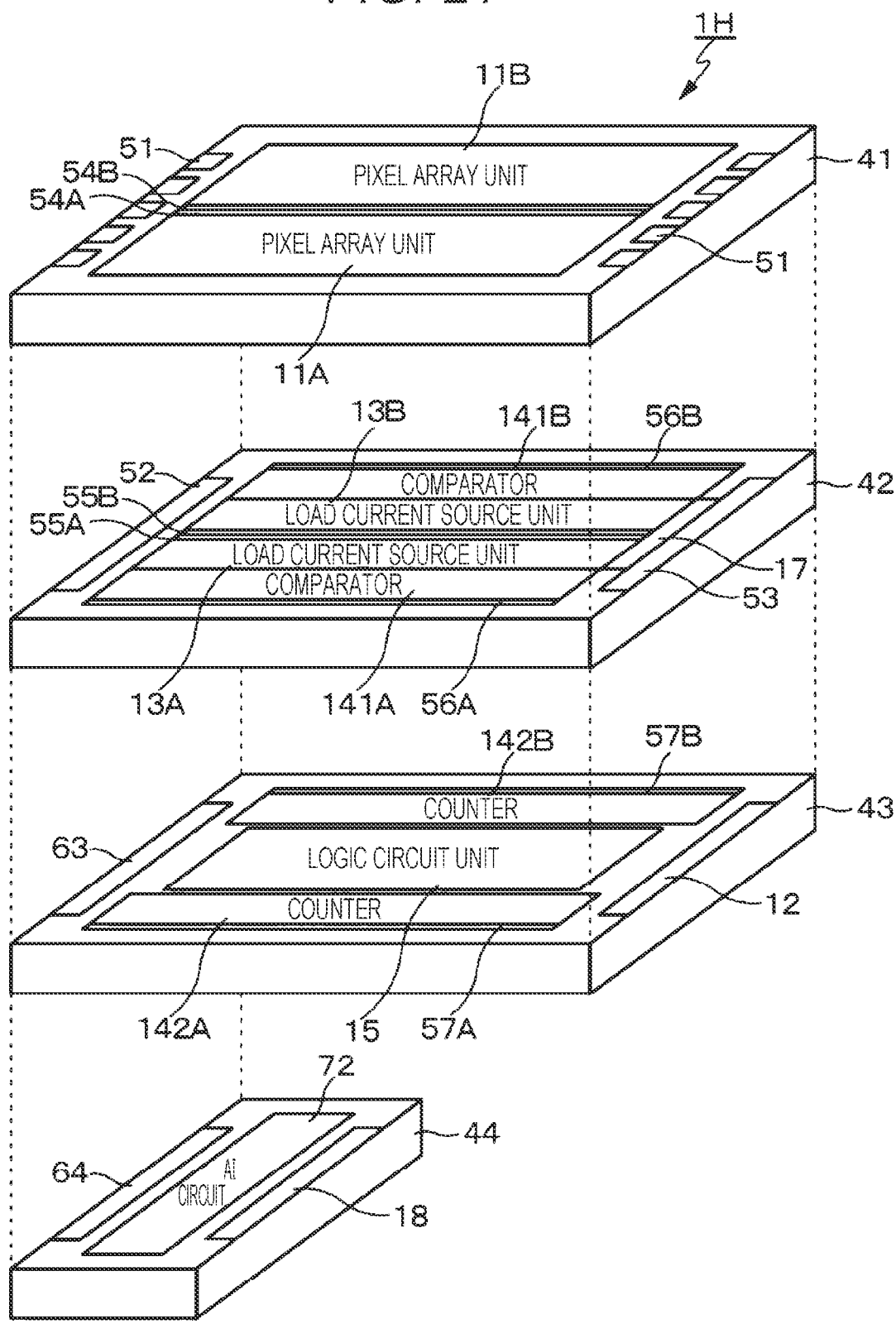
FIG. 21 is a schematic exploded perspective view illustrating a stacked chip structure of a CMOS image sensor according to an eighth embodiment.

FIG. 21 illustrates a schematic exploded perspective view of a stacked chip structure of a CMOS image sensor as an example of an imaging device according to the eighth embodiment to which the technology according to the present disclosure is applied.

As illustrated in FIG. 21, a CMOS image sensor 1H according to the eighth embodiment also has a stacked chip structure in which four semiconductor chips, that is, a semiconductor chip such as a semiconductor chip 41 of a first layer, a semiconductor chip 42 of a second layer, a semiconductor chip 43 of a third layer, and a semiconductor chip 44 of a fourth layer are stacked. However, a size of the semiconductor chip 44 of the fourth layer is smaller than sizes of the other semiconductor chips 41, 42, and 43.

The semiconductor chip 43 of the third layer and the semiconductor chip 44 of the fourth layer are, for example, connected by CoW, and the logic circuit unit 15 on the semiconductor chip 43 of the third layer and the AI circuit 72 on the semiconductor chip 44 of the fourth layer are electrically connected through the connection portion 63 of the third layer and the connection portion 64 of the fourth layer. The AI circuit 72 may be used for, for example, image processing, various settings for analog signals, and the like.

In the CMOS image sensor 1H according to the eighth embodiment having the above stacked chip structure, an advanced process (for example, 12 nm process) can be applied to the semiconductor chip 44 of the fourth layer. Then, since the size of the semiconductor chip 44 of the fourth layer is smaller than the sizes of the other semiconductor chips 41, 42, and 43, a large number of semiconductor chips 44 can be manufactured from one wafer, so that cost reduction can be achieved.

Modification Example

Although the technology according to the present disclosure has been described above on the basis of the preferred embodiments, the technology according to the present disclosure is not limited to the embodiments. The configurations and structures of the imaging device described in the above embodiments are exemplary and can be changed as appropriate.

Application Example

Figure 22:
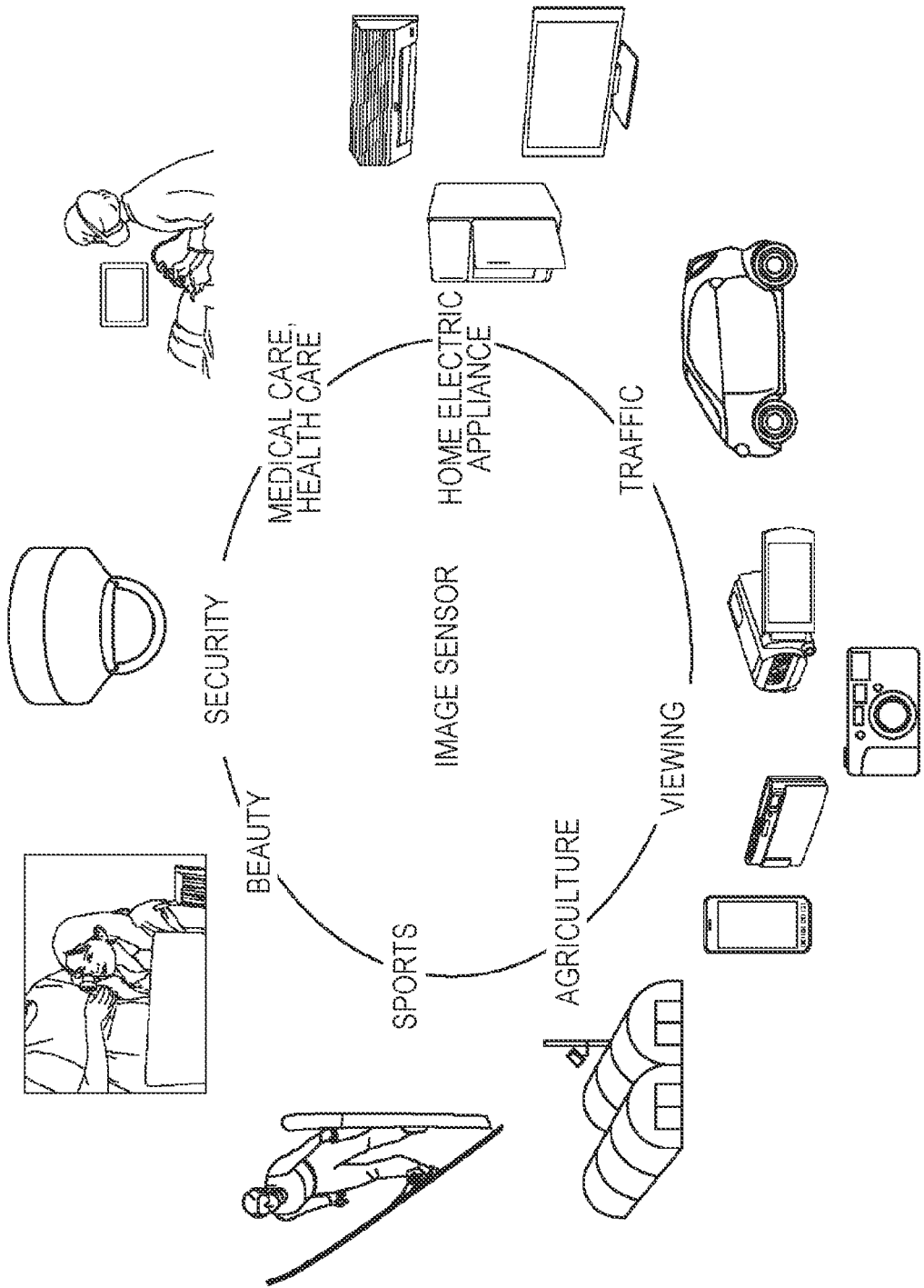
FIG. 22 is a diagram illustrating an application example of the technology according to the present disclosure.

The imaging device according to the present embodiment described above can be used for various devices that sense light such as visible light, infrared light, ultraviolet light, and X-rays, for example, as illustrated in FIG. 22. Specific examples of various devices are listed below.

A device that captures an image to be used for viewing, such as a digital camera or a portable device with a camera function A device used for traffic, such as an in-vehicle sensor that captures images of the front, rear, surroundings, inside, and the like of an automobile for safe driving such as automatic stop, recognition of a driver's condition, and the like, a monitoring camera that monitors traveling vehicles and roads, and a distance measuring sensor that measures a distance between vehicles and the like.

A device used for home electric appliances such as a TV, a refrigerator, and an air conditioner in order to capture an image of a gesture of a user and perform an apparatus operation according to the gesture A device used for medical care or health care, such as an endoscope or a device that performs angiography by receiving infrared light A device used for security, such as a monitoring camera for crime prevention or a camera for person authentication A device used for beauty care, such as a skin measuring instrument for imaging skin or a microscope for imaging scalp A device used for sports, such as an action camera or a wearable camera for sports or the like A device used for agriculture, such as a camera for monitoring conditions of fields and crops Application Example of Technology According to Present Disclosure The technology according to the present disclosure can be applied to various products. Hereinafter, a more specific application example will be described.

[Electronic Apparatus of Present Disclosure]

Here, a case where the present disclosure is applied to an electronic apparatus such as an imaging system of a digital still camera, a video camera, or the like, a mobile terminal device having an imaging function such as a mobile phone, or a copier using an imaging device as an image reading unit will be described.

Example of Imaging System

Figure 23:
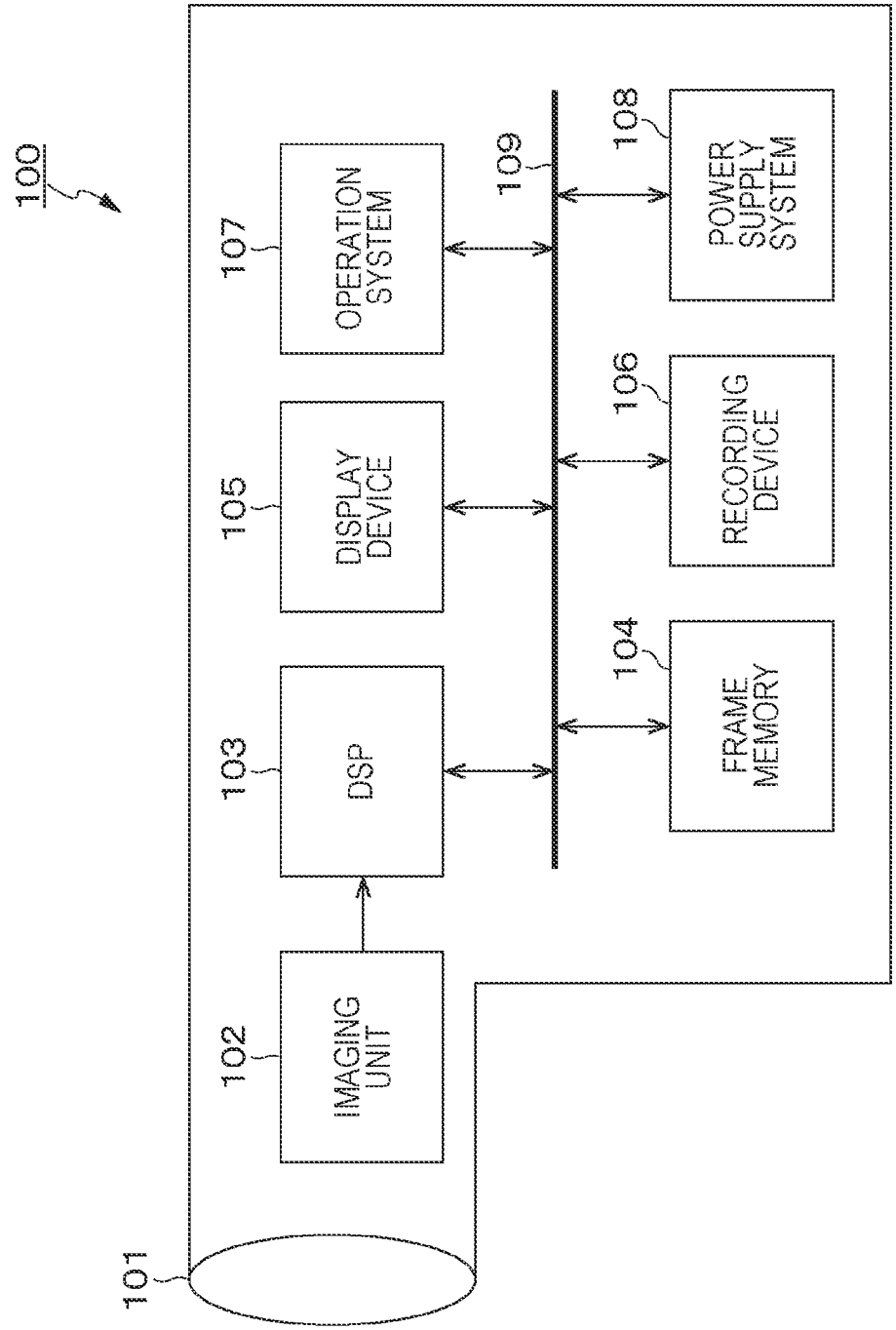
FIG. 23 is a block diagram schematically illustrating an outline of a configuration example of an imaging system which is an example of an electronic apparatus of the present disclosure.

FIG. 23 is a block diagram illustrating a configuration example of an imaging system which is an example of an electronic apparatus of the present disclosure.

As illustrated in FIG. 23, an imaging system 100 according to the present example includes an imaging optical system 101 including a lens group and the like, an imaging unit 102, a digital signal processor (DSP) circuit 103, a frame memory 104, a display device 105, a recording device 106, an operation system 107, a power supply system 108, and the like. Then, the DSP circuit 103, the frame memory 104, the display device 105, the recording device 106, the operation system 107, and the power supply system 108 are connected to each other via a bus line 109.

The imaging optical system 101 captures incident light (image light) from a subject and images the incident light on an imaging surface of the imaging unit 102. The imaging unit 102 converts a light amount of the incident light imaged on the imaging surface by the optical system 101 into an electric signal for each pixel and outputs the electric signal as a pixel signal. The DSP circuit 103 performs general camera signal processing, for example, white balance processing, demosaic processing, gamma correction processing, and the like.

The frame memory 104 is appropriately used for storing data in the process of signal processing in the DSP circuit 103. The display device 105 includes a panel-type display device such as a liquid crystal display device or an organic electro luminescence (EL) display device, and displays a moving image or a still image captured by the imaging unit 102. The recording device 106 records the moving image or the still image captured by the imaging unit 102 on a recording medium such as a portable semiconductor memory, an optical disc, or a hard disk drive (HDD).

The operation system 107 issues operation commands for various functions of the imaging device 100 under the operation of a user. The power supply system 108 appropriately supplies various power sources serving as operation power sources of the DSP circuit 103, the frame memory 104, the display device 105, the recording device 106, and the operation system 107 to these supply targets.

In the imaging system 100 having the above-described configuration, the imaging device according to each of the above-described embodiments may be used as the imaging unit 102. According to the imaging device, it is possible to increase the number of parallel analog-digital converters while maintaining a chip size in which the contribution of the pixel chip formed by arranging the pixels is dominant, and thus to improve a frame rate.

Application Example to Moving Object

The technology according to the present disclosure (present technology) can be applied to various products. For example, the technology according to the present disclosure may be realized as an imaging device mounted on any type of moving object such as an automobile, an electric vehicle, a hybrid electric vehicle, a motorcycle, a bicycle, a personal mobility, an airplane, a drone, a ship, a robot, a construction machine, or an agricultural machine (tractor).

Figure 24:
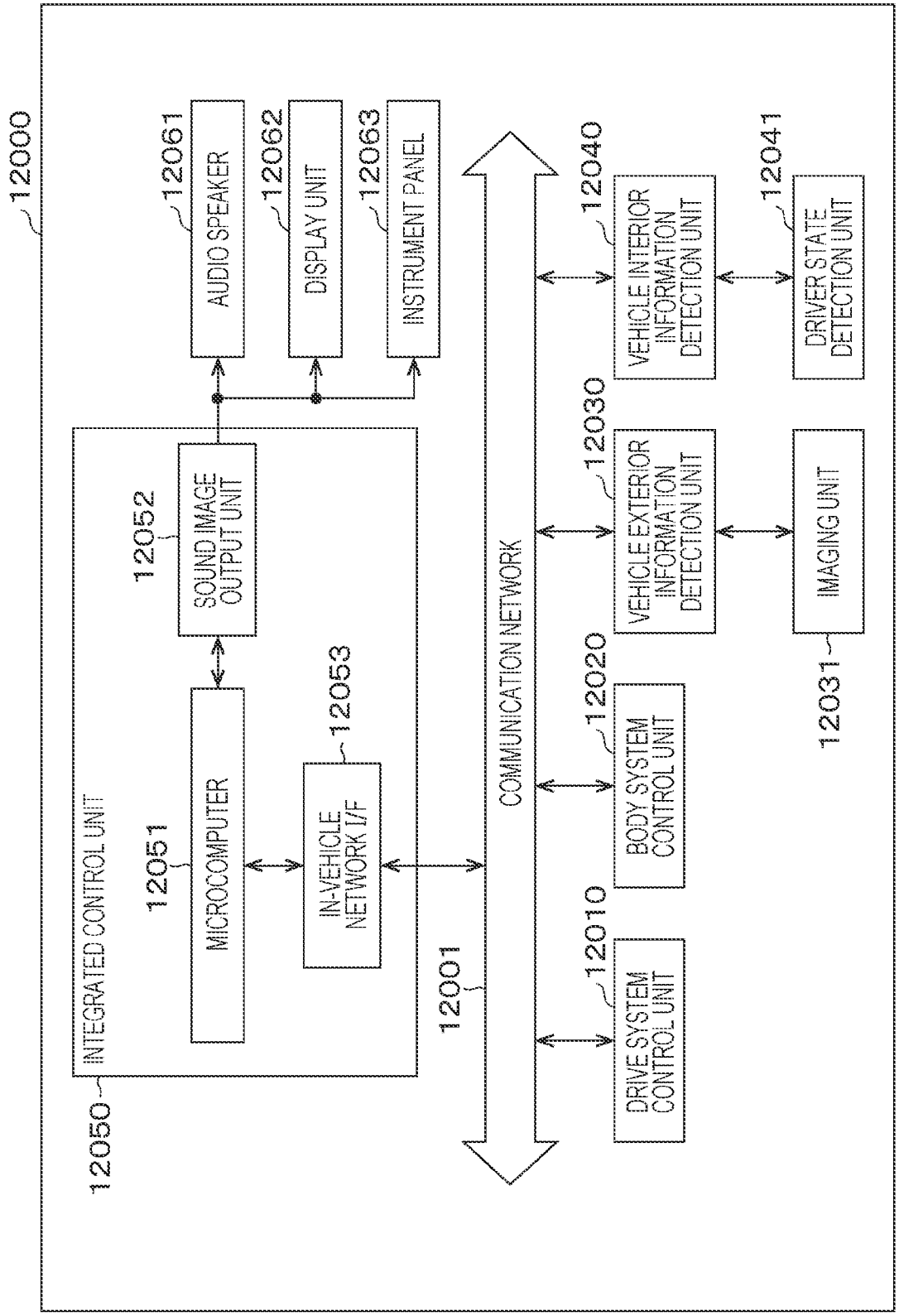
FIG. 24 is a block diagram illustrating a schematic configuration example of a vehicle control system which is an example of a moving object control system to which the technology according to the present disclosure is applicable.

FIG. 24 is a block diagram illustrating a schematic configuration example of a vehicle control system which is an example of a moving object control system to which the technology according to the present disclosure can be applied.

A vehicle control system 12000 includes a plurality of electronic control units connected via a communication network 12001. In the example illustrated in FIG. 24, the vehicle control system 12000 includes a drive system control unit 12010, a body system control unit 12020, a vehicle exterior information detection unit 12030, a vehicle interior information detection unit 12040, and an integrated control unit 12050. Furthermore, as a functional configuration of the integrated control unit 12050, a microcomputer 12051, a sound image output unit 12052, and an in-vehicle network interface (I/F) 12053 are illustrated.

The drive system control unit 12010 controls operations of devices related to the drive system of a vehicle according to various programs. For example, the drive system control unit 12010 functions as a control device for a drive force generation device that generates a drive force of the vehicle, such as an internal combustion engine or a drive motor, a drive force transmission mechanism for transmitting the drive force to wheels, a steering mechanism that adjusts a steering angle of the vehicle, a braking device that generates a braking force of the vehicle, and the like.

The body system control unit 12020 controls operations of various devices mounted on the vehicle body according to various programs. For example, the body system control unit 12020 functions as a control device for a keyless entry system, a smart key system, a power window device, or various lamps such as a headlamp, a tail lamp, a brake lamp, a blinker, or a fog lamp. In this case, radio waves transmitted from a portable device that substitutes for a key or signals of various switches may be input to the body system control unit 12020. The body system control unit 12020 receives input of these radio waves or signals, and controls a door lock device, a power window device, a lamp, and the like of the vehicle.

The vehicle exterior information detection unit 12030 detects information outside the vehicle on which the vehicle control system 12000 is mounted. For example, the imaging unit 12031 is connected to the vehicle exterior information detection unit 12030. The vehicle exterior information detection unit 12030 causes the imaging unit 12031 to capture an image of the outside of the vehicle, and receives the captured image. The vehicle exterior information detection unit 12030 may perform an object detection process or a distance detection process for a person, a vehicle, an obstacle, a sign, a character on a road surface, or the like on the basis of the received image.

The imaging unit 12031 is an optical sensor that receives light and outputs an electric signal corresponding to an amount of received light. The imaging unit 12031 may output the electric signal as an image or may output the electric signal as distance measurement information. Furthermore, the light received by the imaging unit 12031 may be visible light or invisible light such as infrared rays.

The vehicle interior information detection unit 12040 detects vehicle interior information. For example, a driver state detection unit 12041 that detects a state of a driver is connected to the vehicle interior information detection unit 12040. The driver state detection unit 12041 includes, for example, a camera that images the driver, and the vehicle interior information detection unit 12040 may calculate the degree of fatigue or the degree of concentration of the driver or may determine whether or not the driver is dozing off on the basis of the detection information input from the driver state detection unit 12041.

The microcomputer 12051 may calculate a control target value for the drive force generation device, the steering mechanism, or the braking device on the basis of the vehicle interior and exterior information acquired by the vehicle exterior information detection unit 12030 or the vehicle interior information detection unit 12040, and output a control command to the drive system control unit 12010. For example, the microcomputer 12051 can perform cooperative control for the purpose of realizing functions of an advanced driver assistance system (ADAS) including collision avoidance or impact mitigation of the vehicle, tracking traveling based on an inter-vehicle distance, vehicle speed keeping traveling, vehicle collision warning, vehicle lane departure warning, or the like.

Furthermore, the microcomputer 12051 controls the drive force generation device, the steering mechanism, the braking device, or the like on the basis of the information around the vehicle acquired by the vehicle exterior information detection unit 12030 or the vehicle interior information detection unit 12040, and thus performs cooperative control for the purpose of automated driving or the like in which the vehicle automatedly travels without depending on an operation of the driver.

Furthermore, the microcomputer 12051 may output a control command to the body system control unit 12020 on the basis of the vehicle exterior information acquired by the vehicle exterior information detection unit 12030. For example, the microcomputer 12051 may perform cooperative control for the purpose of preventing glare, such as switching from a high beam to a low beam, by controlling the headlamp according to a position of a preceding vehicle or an oncoming vehicle detected by the vehicle exterior information detection unit 12030.

The sound image output unit 12052 transmits an output signal of at least one of sound or an image to an output device capable of visually or audibly notifying an occupant of the vehicle or the outside of the vehicle of information. In the example in FIG. 24, an audio speaker 12061, a display unit 12062, and an instrument panel 12063 are exemplified as the output device. The display unit 12062 may include, for example, at least one of an on-board display or a head-up display.

Figure 25:
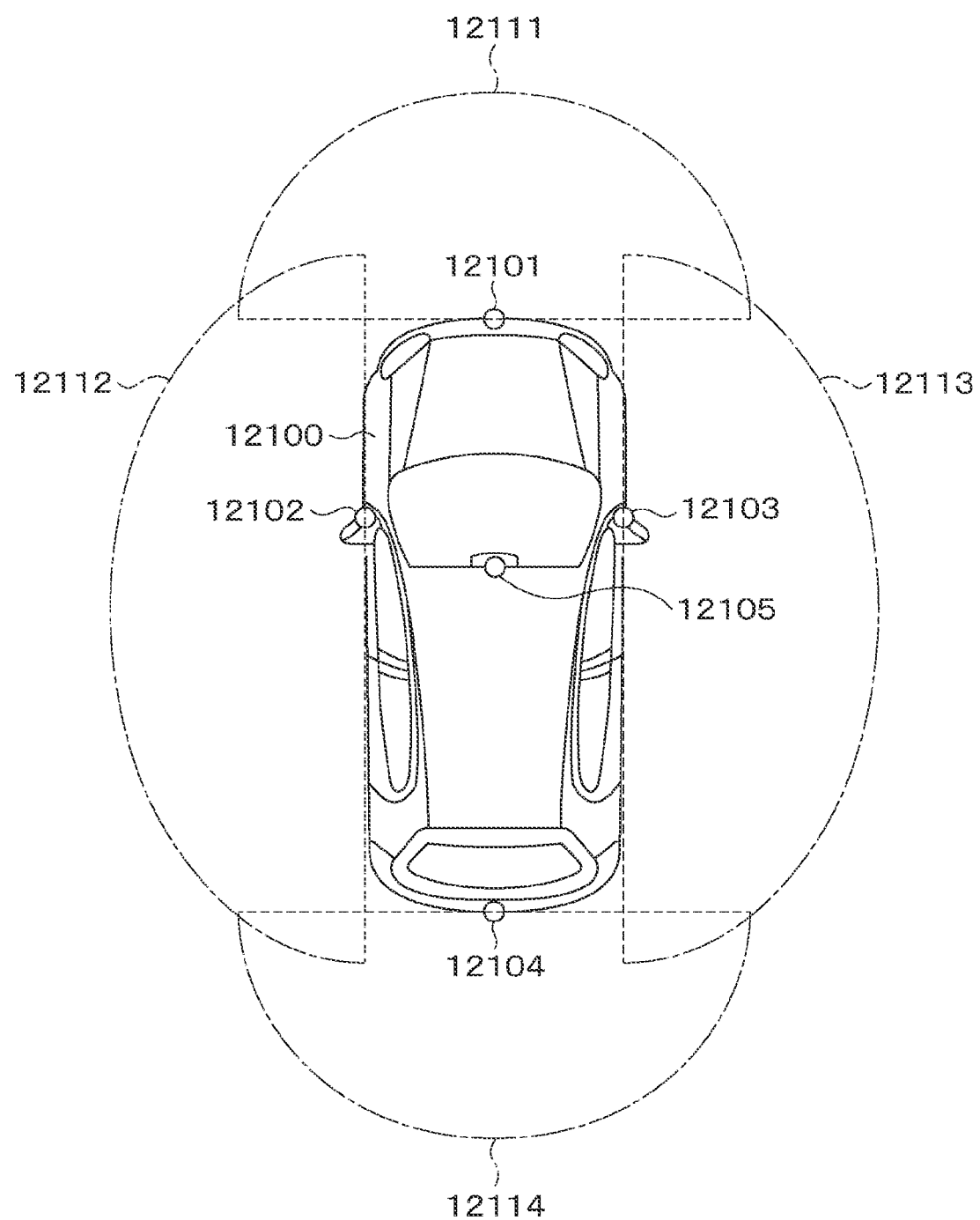
FIG. 25 is a diagram illustrating an example of an installation position of an imaging unit in the moving object control system.

FIG. 25 is a diagram illustrating an example of an installation position of the imaging unit 12031.

In FIG. 25, the vehicle 12100 includes imaging units 12101, 12102, 12103, 12104, and 12105 as the imaging unit 12031.

The imaging units 12101, 12102, 12103, 12104, and 12105 are provided at positions such as a front nose, a side mirror, a rear bumper, a back door, and an upper portion of a windshield in a vehicle cabin of the vehicle 12100, for example. The imaging unit 12101 provided at the front nose and the imaging unit 12105 provided at the upper portion of the windshield in the vehicle cabin mainly acquire images in front of the vehicle 12100. The imaging units 12102 and 12103 provided at the side mirrors mainly acquire images of the sides of the vehicle 12100. The imaging unit 12104 provided on the rear bumper or the back door mainly acquires an image behind the vehicle 12100. Front images acquired by the imaging units 12101 and 12105 are mainly used for detecting a preceding vehicle, a pedestrian, an obstacle, a traffic signal, a traffic sign, a lane, or the like.

Note that FIG. 25 illustrates an example of imaging ranges of the imaging units 12101 to 12104. An imaging range 12111 indicates an imaging range of the imaging unit 12101 provided at the front nose, imaging ranges 12112 and 12113 indicate imaging ranges of the imaging units 12102 and 12103 provided at the side mirrors, respectively, and an imaging range 12114 indicates an imaging range of the imaging unit 12104 provided at the rear bumper or the back door. For example, by superimposing image data captured by the imaging units 12101 to 12104, an overhead view image of the vehicle 12100 viewed from above is obtained.

At least one of the imaging units 12101 to 12104 may have a function of acquiring distance information. For example, at least one of the imaging units 12101 to 12104 may be a stereo camera including a plurality of imaging elements, or may be an imaging element having pixels for phase difference detection.

For example, the microcomputer 12051 may obtain a distance to each three-dimensional object in the imaging ranges 12111 to 12114 and a temporal change in the distance (relative speed with respect to the vehicle 12100) on the basis of distance information obtained from the imaging units 12101 to 12104, and thus extract, as a preceding vehicle, a three-dimensional object traveling at a predetermined speed (for example, 0 km/h or more) in substantially the same direction as the vehicle 12100, in particular, the closest three-dimensional object on a traveling path of the vehicle 12100. Moreover, the microcomputer 12051 may set an inter-vehicle distance to be secured in advance behind the preceding vehicle, and perform automatic brake control (including tracking stop control), automatic acceleration control (including tracking start control), and the like. As described above, it is possible to perform cooperative control for the purpose of automated driving or the like in which the vehicle automatedly travels without depending on an operation of the driver.

For example, on the basis of the distance information obtained from the imaging units 12101 to 12104, the microcomputer 12051 can classify three-dimensional object data regarding three-dimensional objects into two-wheeled vehicles, ordinary vehicles, large vehicles, pedestrians, and other three-dimensional objects such as utility poles, extract the three-dimensional object data, and use the three-dimensional object data for automatic avoidance of obstacles. For example, the microcomputer 12051 identifies obstacles around the vehicle 12100 as obstacles that can be visually recognized by the driver of the vehicle 12100 and obstacles that are difficult to visually recognize. Then, the microcomputer 12051 determines a collision risk indicating a risk of collision with each obstacle, and when the collision risk is a set value or more and there is a possibility of collision, the microcomputer may perform driving assistance for collision avoidance by outputting an alarm to the driver via the audio speaker 12061 or the display unit 12062 or performing forced deceleration or avoidance steering via the drive system control unit 12010.

At least one of the imaging units 12101 to 12104 may be an infrared camera that detects infrared rays. For example, the microcomputer 12051 may recognize a pedestrian by determining whether or not a pedestrian is present in captured images from the imaging units 12101 to 12104. Such pedestrian recognition is performed according to, for example, a procedure of extracting feature points in the captured images from the imaging units 12101 to 12104 as infrared cameras, and a procedure of performing a pattern matching process on a series of feature points indicating a contour of an object to determine whether or not the object is a pedestrian. In a case where the microcomputer 12051 determines that a pedestrian is present in the captured images from the imaging units 12101 to 12104 and recognizes the pedestrian, the sound image output unit 12052 controls the display unit 12062 to superimpose and display a square contour line for emphasis on the recognized pedestrian. Furthermore, the sound image output unit 12052 may control the display unit 12062 to display an icon or the like indicating a pedestrian at a desired position.

An example of the vehicle control system to which the technology according to the present disclosure can be applied has been described above. The technology according to the present disclosure can be applied to, for example, the imaging unit 12031 and the like among the configurations described above. Then, by applying the technology according to the present disclosure to the imaging unit 12031 and the like, the number of parallel analog-digital converters can be increased while maintaining a chip size in which the contribution of a pixel chip formed by arranging the pixels is dominant, so that a frame rate can be improved.

Configuration that can be Taken by Present Disclosure

Note that the present disclosure can also have the following configurations.

<<A. Imaging Device>>

[A-01]

An imaging device having a stacked chip structure in which at least three semiconductor chips including a semiconductor chip of a first layer, a semiconductor chip of a second layer, and a semiconductor chip of a third layer are stacked, the imaging device including:

a pixel array unit in which pixels are two-dimensionally arranged in a matrix and that is formed on the semiconductor chip of the first layer;

an analog circuit unit of an analog-digital conversion unit that converts an analog pixel signal read from each pixel of the pixel array unit through a signal line into a digital pixel signal and is disposed on one of the semiconductor chip of the second layer and the semiconductor chip of the third layer; and a digital circuit unit of the analog-digital conversion unit that is disposed on the other of the semiconductor chip of the second layer and the semiconductor chip of the third layer.

[A-02]

The imaging device according to the above [A-01], in which the analog-digital conversion unit includes a plurality of analog-digital converters provided to correspond to pixel columns of the pixel array unit, the analog-digital converter includes a comparator that compares the analog pixel signal with a reference signal of a ramp wave, and a counter that measures a time from a generation timing of the reference signal to an intersection between the analog pixel signal and the reference signal of the ramp wave, the comparator of the analog-digital conversion unit is disposed on one of the semiconductor chip of the second layer and the semiconductor chip of the third layer, and the counter of the analog-digital conversion unit is disposed on the other of the semiconductor chip of the second layer and the semiconductor chip of the third layer.

[A-03]

The imaging device according to the above [A-02], in which the comparator of the analog-digital conversion unit and a load current source connected to the signal line are disposed on the semiconductor chip of the second layer, and the counter of the analog-digital conversion unit, a logic circuit unit, and an interface are disposed on the semiconductor chip of the third layer.

[A-04]

The imaging device according to the above [A-03], in which a memory unit is disposed on the semiconductor chip of the third layer in addition to the counter of the analog-digital conversion unit, the logic circuit unit, and the interface.

[A-05]

The imaging device according to the above [A-03], in which an AI circuit is disposed on the semiconductor chip of the third layer in addition to the counter of the analog-digital conversion unit, the logic circuit unit, and the interface.

[A-06]

The imaging device according to the above [A-03], further including:

a semiconductor chip of a fourth layer, in which a memory unit is disposed on the semiconductor chip of the fourth layer.

[A-07]

The imaging device according to the above [A-03], further including:

a semiconductor chip of a fourth layer, in which an AI circuit is disposed on the semiconductor chip of the fourth layer.

[A-08]

The imaging device according to the above [A-07], in which a size of the semiconductor chip of the fourth layer is smaller than sizes of the semiconductor chips of the other layers.

[A-09]

The imaging device according to the above [A-02], in which the counter of the analog-digital conversion unit, a logic circuit unit, and an interface are disposed on the semiconductor chip of the second layer, and the comparator of the analog-digital conversion unit and a load current source connected to the signal line are disposed on the semiconductor chip of the third layer.

[A-10]

The imaging device according to any one of the above [A-01] to the above [A-09], in which the analog-digital conversion unit includes a plurality of systems of analog-digital conversion units including a first analog-digital conversion unit and a second analog-digital conversion unit that convert each of analog pixel signals read in parallel from respective pixels in a plurality of pixel rows of the pixel array unit into a digital pixel signal.

[A-11]

The imaging device according to the above [A-10], in which the signal line is divided into a plurality of signal lines including a first signal line and a second signal line corresponding to the analog-digital conversion units of the plurality of systems for each pixel column in a length direction of the signal line.

[A-12]

The imaging device according to the above [A-11], in which a first connection portion that connects the first signal line to the first analog-digital conversion unit and a second connection portion that connects the second signal line to the second analog-digital conversion unit are provided close to each other in a region of the pixel array unit.

[A-13]

The imaging device according to the above [A-12], in which the first connection portion and the second connection portion connect the semiconductor chip of the first layer to the semiconductor chip of the second layer through direct bonding using a Cu electrode.

<<B. Electronic Apparatus>>

[B-01]

An electronic apparatus including:

an imaging device having a stacked chip structure in which at least three semiconductor chips including a semiconductor chip of a first layer, a semiconductor chip of a second layer, and a semiconductor chip of a third layer are stacked, the imaging device including a pixel array unit in which pixels are two-dimensionally arranged in a matrix and that is formed on the semiconductor chip of the first layer, an analog circuit unit of an analog-digital conversion unit that converts an analog pixel signal read from each pixel of the pixel array unit through a signal line into a digital pixel signal and is disposed on one of the semiconductor chip of the second layer and the semiconductor chip of the third layer, and a digital circuit unit of the analog-digital conversion unit that is disposed on the other of the semiconductor chip of the second layer and the semiconductor chip of the third layer.

[B-02]

The electronic apparatus according to the above [B-01], in which
the analog-digital conversion unit includes a plurality of analog-digital converters provided to correspond to pixel columns of the pixel array unit,
the analog-digital converter includes
a comparator that compares the analog pixel signal with a reference signal of a ramp wave, and
a counter that measures a time from a generation timing of the reference signal to an intersection between the analog pixel signal and the reference signal of the ramp wave,
the comparator of the analog-digital conversion unit is disposed on one of the semiconductor chip of the second layer and the semiconductor chip of the third layer, and
the counter of the analog-digital conversion unit is disposed on the other of the semiconductor chip of the second layer and the semiconductor chip of the third layer.

[B-03]

The electronic apparatus according to the above [B-02], in which
the comparator of the analog-digital conversion unit and a load current source connected to the signal line are disposed on the semiconductor chip of the second layer, and
the counter of the analog-digital conversion unit, a logic circuit unit, and an interface are disposed on the semiconductor chip of the third layer.

[B-04]

The electronic apparatus according to the above [B-03], in which
a memory unit is disposed on the semiconductor chip of the third layer in addition to the counter of the analog-digital conversion unit, the logic circuit unit, and the interface.

[B-05]

The electronic apparatus according to the above [B-03], in which
an AI circuit is disposed on the semiconductor chip of the third layer in addition to the counter of the analog-digital conversion unit, the logic circuit unit, and the interface.

[B-06]

The electronic apparatus according to the above [B-03], further including:
a semiconductor chip of a fourth layer, in which
a memory unit is disposed on the semiconductor chip of the fourth layer.

[B-07]

The electronic apparatus according to the above [B-03], further including:
a semiconductor chip of a fourth layer, in which
an AI circuit is disposed on the semiconductor chip of the fourth layer.

[B-08]

The electronic apparatus according to the above [B-07], in which
a size of the semiconductor chip of the fourth layer is smaller than sizes of the semiconductor chips of the other layers.

[B-09]

The electronic apparatus according to the above [B-02], in which
the counter of the analog-digital conversion unit, a logic circuit unit, and an interface are disposed on the semiconductor chip of the second layer, and
the comparator of the analog-digital conversion unit and a load current source connected to the signal line are disposed on the semiconductor chip of the third layer.

[B-10]

The electronic apparatus according to any one of the above [B-01] to the above [B-09], in which
the analog-digital conversion unit includes a plurality of systems of analog-digital conversion units including a first analog-digital conversion unit and a second analog-digital conversion unit that convert each of analog pixel signals read in parallel from respective pixels in a plurality of pixel rows of the pixel array unit into a digital pixel signal.

[B-11]

The electronic apparatus according to the above [B-10], in which
the signal line is divided into a plurality of signal lines including a first signal line and a second signal line corresponding to the analog-digital conversion units of the plurality of systems for each pixel column in a length direction of the signal line.

[B-12]

The electronic apparatus according to the above [B-11], in which
a first connection portion that connects the first signal line to the first analog-digital conversion unit and a second connection portion that connects the second signal line to the second analog-digital conversion unit are provided close to each other in a region of the pixel array unit.

[B-13]

The electronic apparatus according to the above [B-12], in which
the first connection portion and the second connection portion connect the semiconductor chip of the first layer to the semiconductor chip of the second layer through direct bonding using a Cu electrode.

REFERENCE SIGNS LIST

1A First embodiment CMOS image sensor
1B CMOS image sensor according to second embodiment
1C Third embodiment CMOS image sensor
1D CMOS image sensor according to fourth embodiment
1E Fifth embodiment CMOS image sensor
1F CMOS image sensor according to sixth embodiment
1G Seventh embodiment CMOS image sensor
1H CMOS image sensor according to eighth embodiment
11 Pixel array unit
12 Row selection unit
13 Load current source unit
14 Analog-digital conversion unit
15 Logic circuit unit (signal processing unit)
16 Timing control unit
17 Reference signal generation unit
20 Pixel (pixel circuit)
21 Photodiode
22 Transfer transistor
23 Reset transistor
24 Amplification transistor
25 Selection transistor 31 ($31_1$ to $31_n$) Pixel control line
32 ($32_1$ to $32_n$) Signal line
41 Semiconductor chip of first layer
42 Semiconductor chip of second layer
43 Semiconductor chip of third layer
44 Semiconductor chip of fourth layer
71 Memory unit
72 AI circuit
140 Analog-digital converter
141 Comparator
142 Counter

The invention claimed is:

1. An imaging device having a stacked chip structure including a first semiconductor chip of a first layer, a second semiconductor chip of a second layer, a third semiconductor chip of a third layer, and a fourth semiconductor chip of a fourth layer, the imaging device comprising:
a pixel array including pixels two-dimensionally arranged in a matrix on the first semiconductor chip; and
an analog-digital conversion unit including an analog circuit and a digital circuit, the analog circuit being configured to convert an analog pixel signal read from respective pixels of the pixel array through a signal line into a digital pixel signal, the digital circuit being configured to receive the digital pixel signal from the analog circuit, wherein
the analog circuit is disposed on the second semiconductor chip,
the digital circuit is disposed on the third semiconductor chip,
in a cross section view, the pixel array of the first semiconductor chip is electrically connected to the analog circuit of the second semiconductor chip through a Cu—Cu direct bond,
in the cross section view, the digital circuit of the third semiconductor chip is electrically connected to at least one of the analog circuit or the pixel array through an electrode extending through at least one of a via or another Cu—Cu direct bond,
an AI circuit is disposed on the fourth semiconductor chip, and
a size of the fourth semiconductor chip is smaller than sizes of the first, second and third semiconductor chips.

2. The imaging device according to claim 1, wherein the analog-digital conversion unit includes a plurality of analog-digital converters provided to correspond to pixel columns of the pixel array, each of the analog-digital converters including a comparator that compares the analog pixel signal of respective pixel with a reference signal of a ramp wave,
the analog-digital conversion unit includes a counter that measures a time from a generation timing of the reference signal to an intersection between the analog pixel signal and the reference signal of the ramp wave,
the comparator is disposed on the second semiconductor chip, and
the counter is disposed on the third semiconductor chip.

3. The imaging device according to claim 2, wherein a load current source connected to the signal line is disposed on the second semiconductor chip, and a logic circuit unit and an interface are disposed on the third semiconductor chip.

4. The imaging device according to claim 3, wherein a memory is disposed on the third semiconductor chip.

5. The imaging device according to claim 3, wherein an AI circuit is disposed on the third semiconductor chip.

6. The imaging device according to claim 3,
wherein a memory is disposed on the fourth semiconductor chip.

7. The imaging device according to claim 1, wherein
the analog-digital conversion unit includes a plurality of systems of analog-digital conversion units including a first analog-digital conversion unit and a second analog-digital conversion unit that convert each of analog pixel signals read in parallel from respective pixels in a plurality of pixel rows of the pixel array into a digital pixel signal.

8. The imaging device according to claim 7, wherein the signal line is divided into a plurality of signal lines including a first signal line and a second signal line corresponding to the analog-digital conversion units of the plurality of systems for each pixel column in a length direction of the signal line.

9. The imaging device according to claim 8, wherein
a first connection portion that connects the first signal line to the first analog-digital conversion unit and a second connection portion that connects the second signal line to the second analog-digital conversion unit are provided close to each other in a region of the pixel array.

10. An electronic apparatus comprising the imaging device according to claim 1.

11. The electronic apparatus according to claim 10, wherein
the analog-digital conversion unit includes a plurality of analog-digital converters provided to correspond to pixel columns of the pixel array, each of the analog-digital converters including a comparator that compares the analog pixel signal of respective pixel with a reference signal of a ramp wave,
the analog-digital conversion unit includes a counter that measures a time from a generation timing of the reference signal to an intersection between the analog pixel signal and the reference signal of the ramp wave,
the comparator is disposed on the second semiconductor chip, and
the counter is disposed on the third semiconductor chip.

12. The electronic apparatus according to claim 11, wherein a load current source connected to the signal line is disposed on the second semiconductor chip, and a logic circuit unit and an interface are disposed on the third semiconductor chip.

13. The electronic apparatus according to claim 12, wherein a memory is disposed on the third semiconductor chip.

14. The electronic apparatus according to claim 12, wherein an AI circuit is disposed on the third semiconductor chip.

15. The electronic apparatus according to claim 12,
wherein a memory is disposed on the fourth semiconductor chip.

* * * * *